(12) United States Patent
Klunder et al.

(10) Patent No.: US 10,736,205 B2
(45) Date of Patent: Aug. 4, 2020

(54) ELECTRON BEAM TRANSPORT SYSTEM

(71) Applicant: ASML Nethelands B.V., Veldhoven (NL)

(72) Inventors: Roelof Harm Klunder, Eindhoven (NL); Gijsbertus Geert Poorter, Veldhoven (NL); Johannes Aldegonda Theodorus Marie Van Den Homberg, Nederweert (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/339,222

(22) PCT Filed: Sep. 18, 2017

(86) PCT No.: PCT/EP2017/073437
§ 371 (c)(1),
(2) Date: Apr. 3, 2019

(87) PCT Pub. No.: WO2018/065195
PCT Pub. Date: Apr. 12, 2018

(65) Prior Publication Data
US 2019/0246486 A1    Aug. 8, 2019

(30) Foreign Application Priority Data
Oct. 5, 2016 (EP) .................... 16192333

(51) Int. Cl.
*H05H 7/06* (2006.01)
*H05H 9/00* (2006.01)
(Continued)

(52) U.S. Cl.
CPC .......... *H05H 9/00* (2013.01); *G03F 7/70033* (2013.01); *H01J 37/3174* (2013.01);
(Continued)

(58) Field of Classification Search
CPC ...... H05H 9/00; H05H 2007/065; H05H 7/06; H01S 3/0903; G03F 7/70033; H01J 37/3174; H05G 2/008
See application file for complete search history.

(56) References Cited

U.S. PATENT DOCUMENTS

2002/0008450 A1    1/2002  Tanaka
2005/0099145 A1*   5/2005  Nishiuchi ............... H05H 7/06
                                                      315/500
(Continued)

FOREIGN PATENT DOCUMENTS

GB    1025352    4/1966

OTHER PUBLICATIONS

International Search Report and Written Opinion of the International Searching Authority directed to related International Patent Application No. PCT/EP2017/073437, dated Jan. 5, 2018; 15 pages.
(Continued)

*Primary Examiner* — Nicole M Ippolito
*Assistant Examiner* — Sean M Luck
(74) *Attorney, Agent, or Firm* — Sterne, Kessler, Goldstein & Fox P.L.L.C.

(57) ABSTRACT

An electron beam transport system for controlling the position of two different electron beams comprises: a main electron beam transport module; a first input electron beam transport module; a second input electron beam transport module; and a controller. The main electron beam transport module comprises a beam monitoring device disposed at a measurement position. The first input electron beam transport module comprises a first actuator for applying a perturbation to a transverse position of a first electron beam at a first actuation point. The second input electron beam transport module comprises a second actuator for applying a perturbation to a transverse position of a second electron
(Continued)

beam at a second actuation point. The controller is operable to receive a signal from the beam monitoring device and to send control signals to the first actuator and the second actuator. The controller is operable to determine a first quantity indicative of a difference in a transverse position of the first and second electron beams and a second quantity indicative of an average transverse position of the first and second electron beams. The controller is further operable to control the trajectories of the first and second electron beams independently by implementing a first control loop that iteratively attempts to reduce the first quantity by using the first actuator to perturb a trajectory of the first electron beam, and a second control loop that iteratively perturbs a trajectory of the second electron beam using the second actuator such that the average transverse position of the two different electron beams moves towards a desired transverse position.

15 Claims, 8 Drawing Sheets

(51) Int. Cl.
*H01S 3/09* (2006.01)
*G03F 7/20* (2006.01)
*H01J 37/317* (2006.01)
*H05G 2/00* (2006.01)

(52) U.S. Cl.
CPC ........... *H01S 3/0903* (2013.01); *H05G 2/008* (2013.01); *H05H 7/06* (2013.01); *H05H 2007/065* (2013.01)

(56) References Cited

U.S. PATENT DOCUMENTS

2009/0179599 A1 7/2009 Bertozzi et al.
2016/0147161 A1 5/2016 Nikipelov et al.

OTHER PUBLICATIONS

International Preliminary Report on Patentability directed to related International Patent Application No. PCT/EP2017/073437, dated Apr. 9, 2019; 9 pages.

* cited by examiner

ELECTRON BEAM TRANSPORT SYSTEM

CROSS-REFERENCE TO RELATED APPLICATIONS

This application claims priority of EP application no. 16192333.9, which was filed on 5 Oct. 2016 and which is incorporated herein its entirety be reference.

FIELD

The present invention relates to an electron beam transport system, and an associated method, for controlling the position of two different electron beams which follow different trajectories but which share a common main path. The present invention has particular, though not exclusive, application to the control of two electron beams passing through an energy recovery linear accelerator.

BACKGROUND

A lithographic apparatus is a machine constructed to apply a desired pattern onto a substrate. A lithographic apparatus can be used, for example, in the manufacture of integrated circuits (ICs). A lithographic apparatus may for example project a pattern from a patterning device (e.g. a mask) onto a layer of radiation-sensitive material (resist) provided on a substrate.

The wavelength of radiation used by a lithographic apparatus to project a pattern onto a substrate determines the minimum size of features which can be formed on that substrate. A lithographic apparatus which uses EUV radiation, being electromagnetic radiation having a wavelength within the range 4-20 nm, may be used to form smaller features on a substrate than a conventional lithographic apparatus (which may for example use electromagnetic radiation with a wavelength of 193 nm).

A lithographic system may comprise one or more radiation sources, a beam delivery system and one or more lithographic apparatus. The one or more radiation sources may comprise a free electron laser.

It is an object of the present invention to obviate or mitigate at least one problem of prior art techniques.

SUMMARY

According to a first aspect of the invention there is provided a method for controlling the position of two different electron beams, the two electron beams following different trajectories which share a common main path, the method comprising, for at least one control direction: determining a first quantity, the first quantity being indicative of a difference in a transverse position of the two different electron beams in the control direction at a measurement point along the common main path; determining a second quantity, the second quantity being indicative of an average transverse position of the two different electron beams in the control direction at the measurement point; applying a perturbation to a transverse position of a first one of the electron beams at a first actuation point disposed outside of the common main path; implementing a first control loop comprising repeating the following steps one or more times: (a) determining the first quantity; (b) applying a subsequent perturbation to the transverse position of the first electron beam in the control direction at the first actuation point, wherein if the first quantity has increased the subsequent perturbation is in an opposite direction to the previous perturbation applied to the transverse position of the first electron beam and if the first quantity has decreased the subsequent perturbation is in the same direction as the previous perturbation applied to the to the transverse position of the first electron beam; and implementing a second control loop comprising repeating the following steps one or more times: (a) determining the second quantity; (b) applying a perturbation to the transverse position of the second electron beam in the control direction at a second actuation point disposed outside of the common main path, wherein the perturbation applied to the transverse position of the second electron beam is such that the average transverse position of the two different electron beams moves towards a desired transverse position of the two different electron beams.

The method according to the first aspect is advantageous for a number of reasons, as now explained. The method allows the trajectories of the first and second electron beams to be controlled independently. The first control loop iteratively attempts to reduce the first quantity. In particular, the first control loop attempts to move the first electron beam such that its transverse position is closer to that of the second electron beam. The second control loop iteratively attempts to move the second electron beam towards a desired transverse position.

Rather than using the absolute transverse positions of the two different electron beams, the method uses the first quantity (which is indicative of a difference in the transverse position of the two different electron beams) and the second quantity (which is indicative of an average transverse position of the two different electron beams). Since the method does not use the absolute transverse positions of the two different electron beams as input into the control loops, advantageously, the method according to the first aspect of the invention can be applied in arrangements wherein the positions of the first and the second electron beams cannot be temporally resolved.

The method may be particularly suitable for controlling the position of two different electron beams within an energy recovering linear accelerator (ERL). The common main path may comprise a linear accelerator and the two electron beams may comprise a first electron beam that is being accelerated by the linear accelerator and a second electron beam that is being decelerated by the linear accelerator.

The steps of determining the first and/or second quantities may comprise monitoring the output of a beam position monitor disposed at the measurement point.

The first quantity may be determined from a frequency component of a signal from the beam position monitor that corresponds to the repetition frequency of each of the two electron beams.

The second quantity may be determined from a frequency component of a signal from the beam position monitor that corresponds to the total repetition frequency of electron beams through the common main path.

The first and second control loops may operate at different frequencies. This may ensure that the two control loops are stable. It will be appreciated that, in this context, the frequency of a control loop (i.e. the first control loop or the second control loop) is inversely proportional to the time delay between successive iterations of the control loop. This may alternatively be referred to as an update rate or, for an analogue controller, bandwidth.

The steps of applying a perturbation to the transverse position of the first electron beam or the second electron beam may involve any suitable type of actuator (e.g. magnetic coils).

The perturbations that are applied to the transverse position of the first electron beam or the second electron beam may be in steps of any suitable size.

It will be appreciated that a transverse position the two different electron beams is intended to mean a position in a direction that is generally perpendicular to a propagation direction of the two different electron beams. It will be appreciated that the method may further comprise corresponding feedback loops for a second transverse position of the first and second electron beams.

The method may be applied for two linearly independent control directions. The two linearly independent control directions may be mutually perpendicular and may be referred to as the x direction and the y direction.

According to a second aspect of the invention there is provided an electron beam transport system for controlling the position of two different electron beams, the electron beam transport system comprising: a main electron beam transport module defining a main path, the main electron beam transport module comprising a beam monitoring device disposed at a measurement position along the main path; a first input electron beam transport module defining a first input path, the first input electron beam transport module being arranged to deliver a first electron beam to the main electron beam transport module, the first input electron beam transport module comprising a first actuator for applying a perturbation to a transverse position of the first electron beam at a first actuation point disposed along the first input path; a second input electron beam transport module defining a second input path, the second input electron beam transport module being arranged to deliver a second electron beam to the main electron beam transport module, the second input electron beam transport module comprising a second actuator for applying a perturbation to a transverse position of the second electron beam at a second actuation point disposed along the second input path; and a controller operable to receive a signal from the beam monitoring device and to send control signals to the first actuator and the second actuator; wherein the electron beam transport system is operable to determine a first quantity and a second quantity for at least one control direction, the first quantity being indicative of a difference in a transverse position of the first and second electron beams in the control direction at the measurement point and the second quantity being indicative of an average transverse position of the first and second electron beams in the control direction at the measurement point; and wherein the controller is further operable to control the trajectories of the first and second electron beams in the control direction independently by implementing a first control loop that iteratively attempts to reduce the first quantity by using the first actuator to perturb a trajectory of the first electron beam, and a second control loop that iteratively perturbs a trajectory of the second electron beam using the second actuator such that the average transverse position of the two different electron beams moves towards a desired transverse position in the control direction.

The electron beam transport system according to the second aspect is advantageous for a number of reasons, as now explained. The electron beam transport system allows the trajectories of the first and second electron beams to be controlled independently.

Since the controller of the electron beam transport system does not use the absolute transverse positions of the two different electron beams as input into the control loops, advantageously, the electron beam transport system according to the second aspect of the invention can be applied in arrangements wherein the positions of the first and the second electron beams cannot be temporally resolved.

The electron beam transport system is particularly suitable for controlling the position of two different electron beams within an energy recovering linear accelerator (ERL).

The main electron beam transport module may comprise a linear accelerator.

The two electron beams may comprise a first electron beam that is being accelerated by the linear accelerator and a second electron beam that is being decelerated by the linear accelerator.

The electron beam transport system may be operable to determine the first quantity from a frequency component of a signal from the beam position monitor that corresponds to the repetition frequency of each of the first and second electron beams.

The electron beam transport system may be operable to determine the second quantity from a frequency component of a signal from the beam position monitor that corresponds to the total repetition frequency of electron beams through the common main path.

The controller may be arranged to operate the first and second control loops at different frequencies. This may ensure that the two control loops are stable.

It will be appreciated that the controller may comprise any combination of analogue or digital components that can provide the functionality described herein. In one embodiment, the controller may comprise a microprocessor.

The electron beam transport system may be operable to determine a first quantity and a second quantity for two linearly independent control directions. The controller may be operable to control the trajectories of the first and second electron beams in the two linearly independent control directions independently by implementing the first control loop and the second control loop. The two linearly independent control directions may be mutually perpendicular and may be referred to as the x direction and the y direction.

According to a third aspect of the invention there is provided a particle accelerator comprising the electron beam transport system of the second aspect of the invention.

The main electron beam transport module may comprise an accelerator module.

According to a fourth aspect of the invention there is provided a free electron laser comprising: an injector operable to produce a bunched electron beam comprising a plurality of electron bunches; the particle accelerator of the third aspect of the invention arranged to receive the bunched electron beam from the injector and accelerate it to a higher energy; and an undulator arranged to receive the bunched electron beam from the particle accelerator, the undulator comprising a periodic magnet structure, which is operable to produce a periodic magnetic field and is arranged so as to guide the bunched electron beam along an oscillating path about a central axis.

According to a fifth aspect of the invention there is provided a lithographic system comprising: the free electron laser of the fourth aspect of the invention, which is operable to produce a main radiation beam; at least one lithographic apparatus; and a beam delivery system arranged to deliver at least a portion of the main radiation beam to the at least one lithographic apparatus.

Various aspects and features of the invention set out above or below may be combined with various other aspects and features of the invention as will be readily apparent to the skilled person.

BRIEF DESCRIPTION OF THE DRAWINGS

Embodiments of the invention will now be described, by way of example only, with reference to the accompanying schematic drawings, in which.

DETAILED DESCRIPTION

Figure 1:
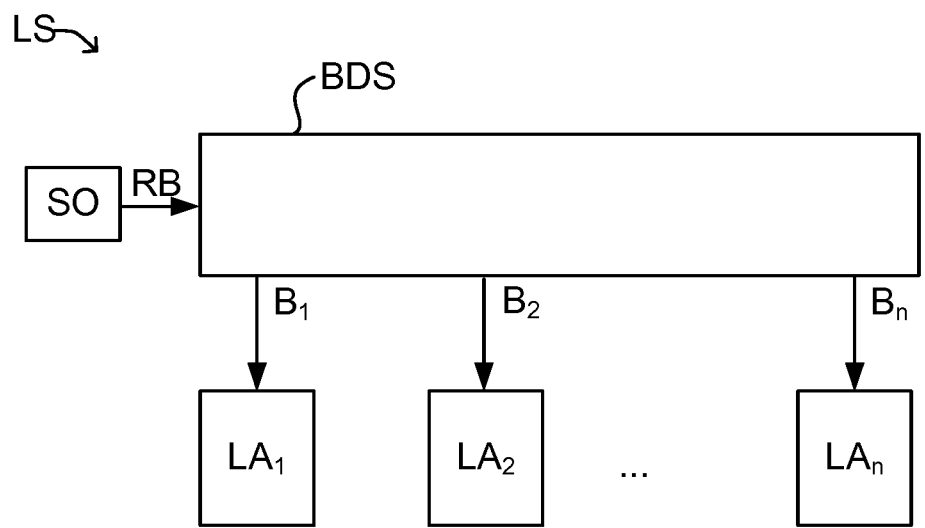
FIG. 1 is a schematic illustration of a lithographic system according to an embodiment of the invention.

FIG. 1 shows a lithographic system LS according to one embodiment of the invention. The lithographic system LS comprises a radiation source SO, a beam delivery system BDS and a plurality of lithographic apparatus $LA_1$-$LA_n$ (e.g. eight lithographic apparatus). The radiation source SO is configured to generate a radiation beam RB (which may be referred to as a main beam). The main beam RB may, for example, comprise extreme ultraviolet (EUV) radiation or deep ultraviolet radiation (DUV).

The beam delivery system BDS comprises beam splitting optics and may optionally also comprise additional beam expanding optics and/or beam shaping optics. The main radiation beam RB is split into a plurality of radiation beams $B_1$-$B_n$ (which may be referred to as branch beams), each of which is directed to a different one of the lithographic apparatus $LA_1$-$LA_n$, by the beam delivery system BDS.

The beam delivery system BDS may comprise beam expanding optics that are arranged to increase a cross section of the main radiation beam RB and/or the branch radiation beams $B_1$-$B_n$. Advantageously, this decreases the heat load on mirrors downstream of the beam expanding optics, for example mirrors within the lithographic apparatus $LA_1$-$LA_n$. This may allow these mirrors to be of a lower specification, with less cooling, and therefore less expensive. Additionally or alternatively, it may allow the downstream mirrors to be nearer to normal incidence.

In an embodiment, the branch radiation beams $B_1$-$B_n$ are each directed through a respective attenuator (not shown). Each attenuator may be arranged to adjust the intensity of a respective branch radiation beam $B_1$-$B_n$ before the branch radiation beam $B_1$-$B_n$ passes into its corresponding lithographic apparatus $LA_1$-$LA_n$.

The radiation source SO, beam delivery system BDS and lithographic apparatus $LA_1$-$LA_n$ may all be constructed and arranged such that they can be isolated from the external environment. A vacuum may be provided in at least part of the radiation source SO, beam delivery system BDS and lithographic apparatuses $LA_1$-$LA_n$ so as to minimise the absorption of EUV radiation. Different parts of the lithographic system LS may be provided with vacuums at different pressures (i.e. held at different pressures which are below atmospheric pressure).

Figure 2:
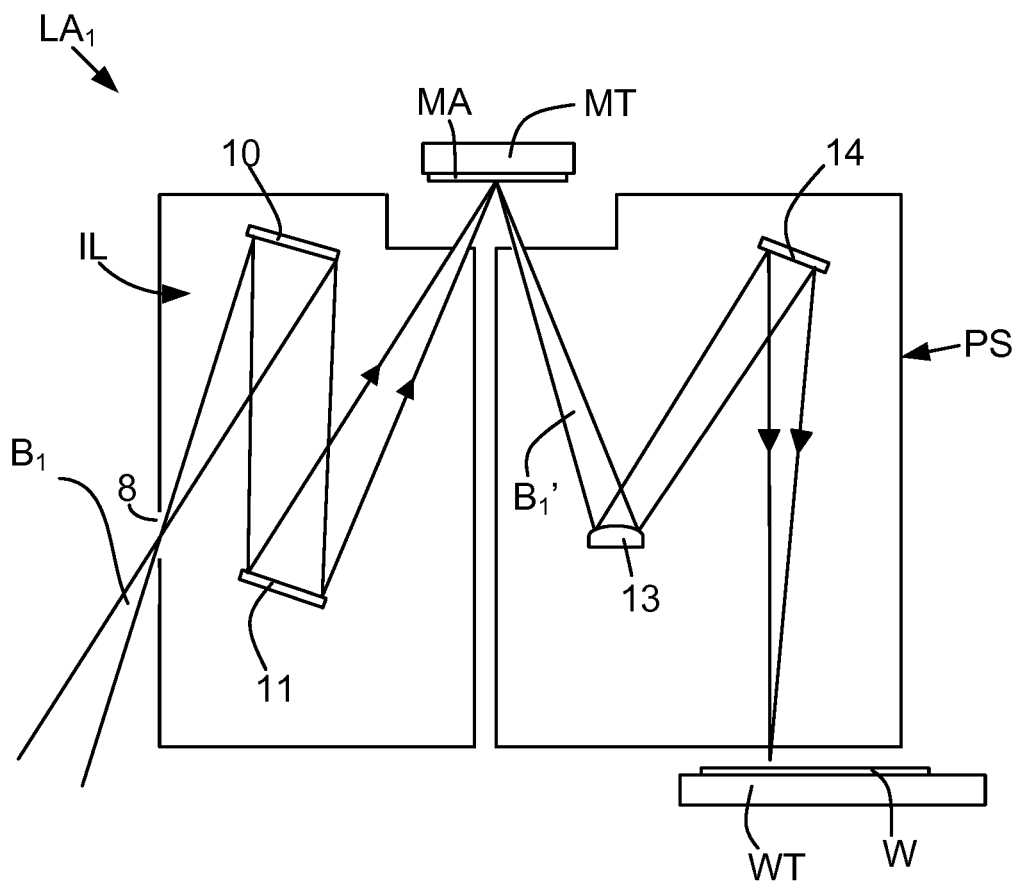
FIG. 2 is a schematic illustration of a lithographic apparatus that may form part of the lithographic system of FIG. 1.

Referring to FIG. 2, a lithographic apparatus $LA_1$ comprises an illumination system IL, a support structure MT configured to support a patterning device MA (e.g. a mask), a projection system PS and a substrate table WT configured to support a substrate W. The illumination system IL is configured to condition the branch radiation beam $B_1$ that is received by that lithographic apparatus $LA_1$ before it is incident upon the patterning device MA. The projection system PS is configured to project the radiation beam $B_1'$ (now patterned by the patterning device MA) onto the substrate W. The substrate W may include previously formed patterns. Where this is the case, the lithographic apparatus aligns the patterned radiation beam $B_1'$ with a pattern previously formed on the substrate W.

The branch radiation beam $B_1$ that is received by the lithographic apparatus $LA_1$ passes into the illumination system IL from the beam delivery system BDS though an opening 8 in an enclosing structure of the illumination system IL. Optionally, the branch radiation beam $B_1$ may be focused to form an intermediate focus at or near to the opening 8.

The illumination system IL may include a facetted field mirror device 10 and a facetted pupil mirror device 11. The faceted field mirror device 10 and faceted pupil mirror device 11 together provide the radiation beam $B_1$ with a desired cross-sectional shape and a desired angular distribution. The radiation beam $B_1$ passes from the illumination system IL and is incident upon the patterning device MA held by the support structure MT. The patterning device MA reflects and patterns the radiation beam to form a patterned beam $B_1'$. The illumination system IL may include other mirrors or devices in addition to or instead of the faceted field mirror device 10 and faceted pupil mirror device 11. The illumination system IL may for example include an array of independently moveable mirrors. The independently moveable mirrors may for example measure less than 1 mm across. The independently moveable mirrors may for example be microelectromechanical systems (MEMS) devices.

Following redirection (e.g. reflection) from the patterning device MA the patterned radiation beam $B_1'$ enters the projection system PS. The projection system PS comprises a plurality of mirrors 13, 14 which are configured to project the radiation beam $B_1'$ onto a substrate W held by the substrate table WT. The projection system PS may apply a reduction factor to the radiation beam, forming an image with features that are smaller than corresponding features on the patterning device MA. A reduction factor of 4 may for example be applied. Although the projection system PS has two mirrors in FIG. 2, the projection system may include any number of mirrors (e.g. six mirrors).

The lithographic apparatus $LA_1$ is operable to impart a radiation beam $B_1$ with a pattern in its cross-section and project the patterned radiation beam onto a target portion of a substrate thereby exposing a target portion of the substrate to the patterned radiation. The lithographic apparatus $LA_1$ may, for example, be used in a scan mode, wherein the support structure MT and the substrate table WT are scanned synchronously while a pattern imparted to the radiation beam $B_1'$ is projected onto a substrate W (i.e. a dynamic exposure). The velocity and direction of the substrate table WT relative to the support structure MT may be determined by the demagnification and image reversal characteristics of the projection system PS. The patterned radiation beam $B_1'$ which is incident upon the substrate W may comprise a band of radiation. The band of radiation may be referred to as an exposure slit. During a scanning exposure, the movement of the substrate table WT and the support structure MT are such that the exposure slit travels over a target portion of substrate W in a scan direction, thereby exposing the target portion of the substrate W to patterned radiation.

Referring again to FIG. 1, the radiation source SO is configured to generate a radiation beam RB (which may comprise EUV radiation) with sufficient power to supply each of the lithographic apparatus $LA_1$-$LA_n$. As noted above, the radiation source SO may comprise a free electron laser.

Figure 3:
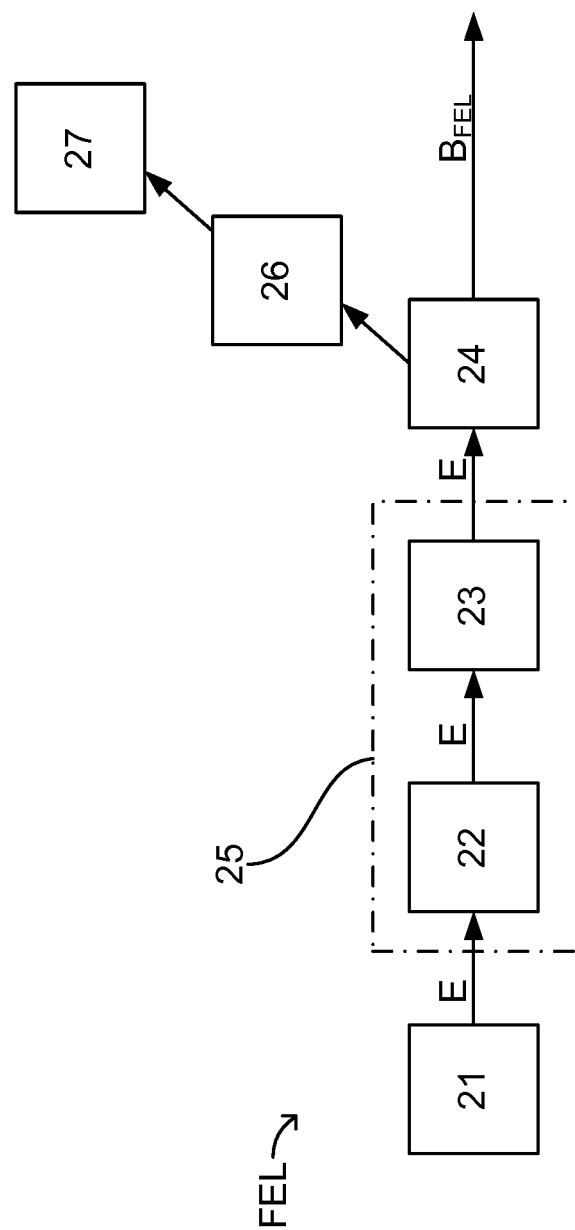
FIG. 3 is a schematic illustration of a free electron laser that may form part of the lithographic system of FIG. 1.

FIG. 3 is a schematic depiction of a free electron laser FEL comprising an injector 21, a particle accelerator 25, an undulator 24, an electron decelerator 26 and a beam dump 27.

The injector 21 is arranged to produce a bunched electron beam E and may comprise an electron source. The electron source may, for example, comprise a thermionic cathode or a photo-cathode arranged to emit electrons and an accelerating electric field arranged to accelerate said electrons so as to form an electron beam. Said electric field may comprise a static electric field, an alternating electromagnetic field or a combination of both. In one embodiment, electrons may be initially accelerated away from a cathode through a static electric field and then may be subsequently accelerated further an a booster than uses alternating fields. The electron source may be operable to produce a bunched electron beam E (e.g. by emitting bursts of electrons from a cathode). Alternatively, the electron source may be operable to produce a continuous electron beam and the injector 21 may further comprise an electron beam chopper arranged to convert the continuous electron beam into a bunched electron beam.

Electrons in the electron beam E are further accelerated by the particle accelerator 25. The particle accelerator 25 comprises one or more accelerator modules 22 and, optionally, a bunch compressor 23.

Each of the accelerator modules 22 may comprise a linear accelerator. In an example, each accelerator module may comprise a plurality of radio frequency cavities, which are axially spaced along a common axis, and one or more radio frequency power sources, which are operable to control the electromagnetic fields along the common axis as bunches of electrons pass between them so as to accelerate each bunch of electrons. The cavities may be superconducting radio frequency cavities. Advantageously, this allows: relatively large electromagnetic fields to be applied at high duty cycles; larger beam apertures, resulting in fewer energy losses due to wakefields; and for the fraction of radio frequency energy that is transmitted to the beam (as opposed to dissipated through the cavity walls) to be increased. Reducing the amount of energy dissipated through the cavity walls (for example by heat) is beneficial since this heat can cause physical damage to parts of the accelerator. The reduction in wakefield generation that is achieved by the larger beam apertures also reduces degradation of the quality of the electron beam as it passes through the accelerator. Alternatively, the cavities may be conventionally conducting (i.e. not superconducting), and may be formed from, for example, copper. Other types of linear accelerators may be used such as, for example, laser wake-field accelerators or inverse free electron laser accelerators.

The electron beam E passes through the bunch compressor 23 before entering the undulator 24. As shown schematically in FIG. 3, the one or more accelerator modules 22 may be separate from the bunch compressor 23, and the bunch compressor 23 may be disposed between the one or more accelerator modules 22 and the undulator 24. The bunch compressor 23 is configured to spatially compress existing bunches of electrons in the electron beam E. In some embodiments the compression achieved by the bunch compressor 23 may be achieved in a plurality of stages. For example, the bunch compressor 23 may be configured to spatially compress existing bunches of electrons in the electron beam E at a plurality of different energies (for example after acceleration by each accelerator module).

The bunch compressor 23 may be arranged to receive the bunched electron beam E, disperse the electron bunches and subsequently recombine them such that the distance travelled by an electron within a given electron bunch is dependent on its energy, thereby changing a longitudinal electron density distribution of the electron bunches. The bunch compressor 23 may comprise an arc or a magnetic chicane, wherein the length of a path followed by an electron as it passes through the chicane is dependent upon its energy.

The electron beam E then passes through the undulator 24. Generally, the undulator 24 comprises a plurality of modules. Each module comprises a periodic magnet structure, which is operable to produce a periodic magnetic field and is arranged so as to guide the relativistic electron beam E produced by the injector 21 and particle accelerator 25 along a periodic path within that module. The periodic magnetic field produced by each undulator module causes the electrons to follow an oscillating path about a central axis. As a result, within each undulator module, the electrons radiate electromagnetic radiation generally in the direction of the central axis of that undulator module.

The path followed by the electrons may be sinusoidal and planar, with the electrons periodically traversing the central axis. Alternatively, the path may be helical, with the electrons rotating about the central axis. The type of oscillating path may affect the polarization of radiation emitted by the free electron laser. For example, a free electron laser which causes the electrons to propagate along a helical path may emit elliptically polarized radiation, which may be desirable for exposure of a substrate W by some lithographic apparatus.

As electrons move through each undulator module, they interact with the electric field of the radiation, exchanging energy with the radiation. In general the amount of energy exchanged between the electrons and the radiation will oscillate rapidly unless conditions are close to a resonance condition. Under resonance conditions, the interaction between the electrons and the radiation causes the electrons to bunch together into microbunches, modulated at the wavelength of radiation within the undulator, and coherent emission of radiation along the central axis is stimulated. The resonance condition may be given by:

$$\lambda_{em} = \frac{\lambda_u}{2\gamma^2}\left(1 + \frac{K^2}{A}\right), \quad (1)$$

where $\lambda_{em}$ is the wavelength of the radiation, $\lambda_u$ is the undulator period for the undulator module that the electrons are propagating through, y is the Lorentz factor of the electrons and K is the undulator parameter. A is dependent upon the geometry of the undulator 24: for a helical undulator that produces circularly polarized radiation A=1, for a planar undulator A=2, and for a helical undulator which produces elliptically polarized radiation (that is neither circularly polarized nor linearly polarized) 1<A<2. In practice, each bunch of electrons will have a spread of energies although this spread may be minimized as far as possible (by producing an electron beam E with low emittance). The undulator parameter K is typically approximately 1 and is given by:

$$K = \frac{q\lambda_u B_0}{2\pi mc}, \quad (2)$$

where q and m are, respectively, the electric charge and mass of the electrons, $B_0$ is the amplitude of the periodic magnetic field, and c is the speed of light.

The resonant wavelength $\lambda_{em}$ is equal to the first harmonic wavelength spontaneously radiated by electrons moving through each undulator module. The free electron laser FEL may operate in self-amplified spontaneous emission (SASE) mode. Operation in SASE mode may require a low energy spread of the electron bunches in the electron beam E before it enters each undulator module. Alternatively, the free electron laser FEL may comprise a seed radiation source, which may be amplified by stimulated emission within the undulator 24. The free electron laser FEL may operate using an optical cavity, such as in, for example, a recirculating amplifier free electron laser (RAFEL), wherein a portion of the radiation generated by the free electron laser FEL is used to seed further generation of radiation.

Electrons moving through the undulator 24 may cause the amplitude of radiation to increase, i.e. the free electron laser FEL may have a non-zero gain. Maximum gain may be achieved when the resonance condition is met or when conditions are close to but slightly off resonance.

An electron which meets the resonance condition as it enters the undulator 24 will lose (or gain) energy as it emits (or absorbs) radiation, so that the resonance condition is no longer satisfied. Therefore, in some embodiments the undulator 24 may be tapered. That is, the amplitude of the periodic magnetic field and/or the undulator period $\lambda_u$ may vary along the length of the undulator 24 in order to keep bunches of electrons at or close to resonance as they are guided though the undulator 24. The tapering may be achieved by varying the amplitude of the periodic magnetic field and/or the undulator period $\lambda_u$ within each undulator module and/or from module to module. Additionally or alternatively tapering may be achieved by varying the helicity of the undulator 24 (by varying the parameter A) within each undulator module and/or from module to module.

A region around the central axis of each undulator module may be considered to be a "good field region". The good field region may be a volume around the central axis wherein, for a given position along the central axis of the undulator module, the magnitude and direction of the magnetic field within the volume are substantially constant. An electron bunch propagating within the good field region may satisfy the resonant condition of Eq. (1) and will therefore amplify radiation. Further, an electron beam E propagating within the good field region should not experience significant unexpected disruption due to uncompensated magnetic fields. That is, an electron propagating through the good field region should remain within the good field region.

Each undulator module may have a range of acceptable initial trajectories. Electrons entering an undulator module with an initial trajectory within this range of acceptable initial trajectories may satisfy the resonant condition of Eq. (1) and interact with radiation in that undulator module to stimulate emission of coherent radiation. In contrast, electrons entering an undulator module with other trajectories may not stimulate significant emission of coherent radiation.

For example, generally, for helical undulator modules the electron beam E should be substantially aligned with the central axis of the undulator module. A tilt or angle between the electron beam E and the central axis of the undulator module (in radians) should generally not exceed $\rho/10$, where $\rho$ is the FEL Pierce parameter. Otherwise the conversion efficiency of the undulator module (i.e. the portion of the energy of the electron beam E which is converted to radiation in that module) may drop below a desired amount (or may drop almost to zero). In an embodiment, the FEL Pierce parameter of an EUV helical undulator module may be of the order of 0.001, indicating that the tilt of the electron beam E with respect to the central axis of the undulator module should be less than 100 μrad.

For a planar undulator module, a greater range of initial trajectories may be acceptable. Provided the electron beam E remains substantially perpendicular to the magnetic field of a planar undulator module and remains within the good field region of the planar undulator module, coherent emission of radiation may be stimulated.

As electrons of the electron beam E move through a drift space between each undulator module, the electrons do not follow a periodic path. Therefore, in this drift space, although the electrons overlap spatially with the radiation, they do not exchange any significant energy with the radiation and are therefore effectively decoupled from the radiation. The bunched electron beam E has a finite emittance and will therefore increase in diameter unless refocused. Therefore, the undulator 24 may further comprise a mechanism for refocusing the electron beam E in between one or more pairs of adjacent undulator modules. For example, one or more quadrupole magnets may be provided between each pair of adjacent modules. The quadrupole magnets reduce the size of the electron bunches in a plane perpendicular to the trajectory of the electron beam E. This improves the coupling between the electrons and the radiation within the next undulator module, increasing the stimulation of emission of radiation.

The undulator 24 may further comprise an electron beam steering unit upstream of the first undulator module, which is arranged to ensure that as the electron beam enters the first undulator module it has a trajectory from the range of acceptable initial trajectories for the first undulator module and that it is within the good field region. The undulator 24 may further comprise an electron beam steering unit in between each adjacent pair of undulator modules which is arranged to provide fine adjustment of the electron beam E as it passes through the undulator 24. For example, each beam steering unit may be arranged to ensure that the electron beam remains within the good field region and enters the next undulator module with a trajectory from the range of acceptable initial trajectories for that undulator module.

Radiation produced within the undulator 24 is output as a radiation beam $B_{FEL}$ (which may, for example, correspond to the radiation beam RB of FIG. 1).

After leaving the undulator 24, the electron beam E is absorbed by a dump 27. The dump 27 may comprise a sufficient quantity of material to absorb the electron beam E. The material may have a threshold energy for induction of radioactivity. The threshold energy for induction of radioactivity may be referred to as the activation energy. Electrons entering the dump 27 with an energy below the threshold energy may produce only gamma ray showers but will not induce any significant level of radioactivity. The material may have a high threshold energy for induction of radioactivity by electron impact. For example, the beam dump may comprise aluminium (Al), which has a threshold energy of around 17 MeV. It may be desirable to reduce the energy of electrons in the electron beam E before they enter the dump 27. This removes, or at least reduces, the need to remove and dispose of radioactive waste from the dump 27. This is advantageous since the removal of radioactive waste requires the free electron laser FEL to be shut down periodically and the disposal of radioactive waste can be costly and can have serious environmental implications.

The energy of electrons in the electron beam E is reduced before they enter the dump 27 by directing the electron beam E through a decelerator 26 disposed between the undulator 24 and the beam dump 27.

In an embodiment the electron beam E which exits the undulator 24 may be decelerated by passing the electrons back through the accelerator modules 22 of the particle accelerator 25 with a phase difference of approximately 180 degrees relative to the electron beam produced by the injector 21. The RF fields in the accelerator modules 22 therefore serve to decelerate the electrons which are output from the undulator 24 and to accelerate electrons output from the injector 21. As the electrons decelerate in the particle accelerator 25 some of their energy is transferred to the RF fields in the accelerator modules 22. Energy from the decelerating electrons is therefore recovered by the particle accelerator 25 and may be used to accelerate the electron beam E output from the injector 21. Such an arrangement is known as an energy recovering linear accelerator (ERL). Arranging the phases such that the bunches of decelerating electrons enter the accelerator modules 22 of the particle accelerator 25 approximately 180° out of phase with the accelerating electrons ensures that the energy recovered by the particle accelerator 25 is approximately equal to the amount of energy required to accelerate the accelerating electrons. However, in practice, the phase difference between the accelerating and decelerating electron bunches may not be 180° and may, for example, be up to of the order of 10° above or below 180° (i.e. between 170° and 190°). There may be some advantage to such a small offset from a phase difference of 180°.

Figure 4:
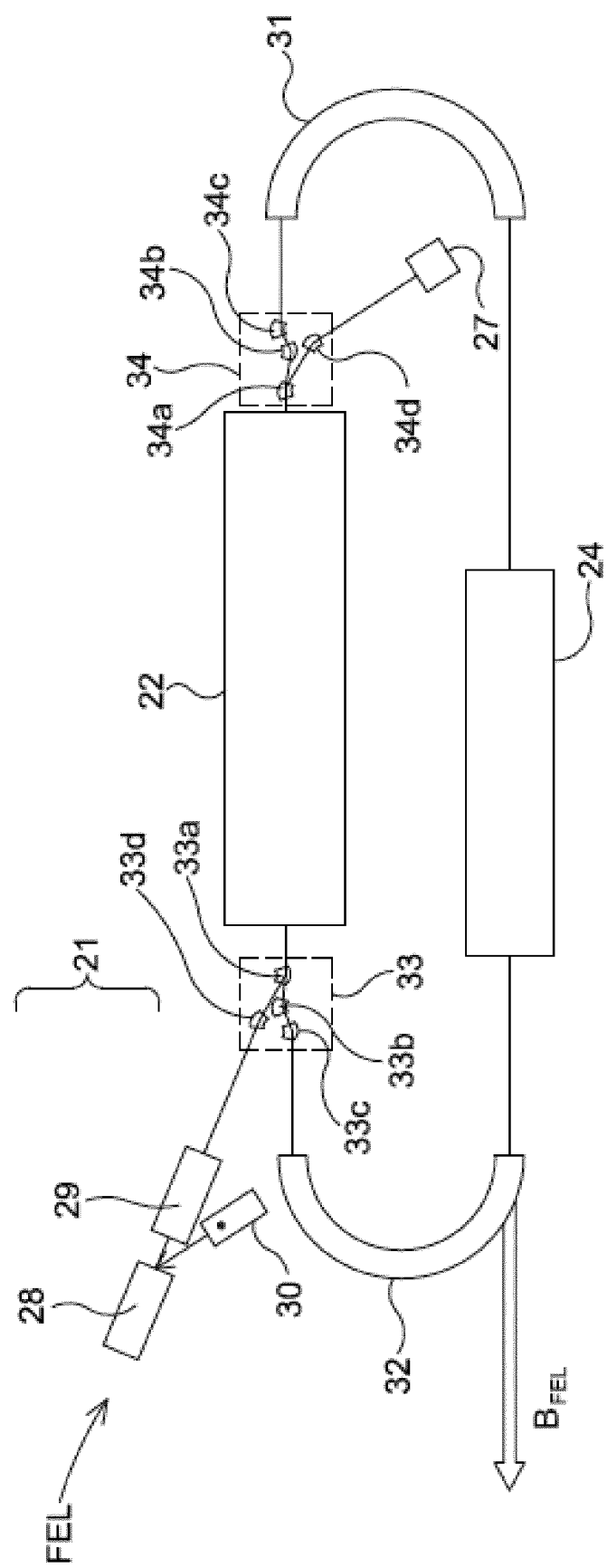
FIG. 4 is a schematic illustration of a free electron laser incorporating an energy recovering linear accelerator that may form part of the lithographic system of FIG. 1.

FIG. 4 shows a free electron laser FEL that incorporates an energy recovering linear accelerator. In the embodiment shown in FIG. 4, the injector 21 comprises an electron source 28, a booster 29 and a driver laser 30. In this embodiment, the drive laser 30 is arranged to irradiate a photocathode within electron source 28 with a pulsed laser beam. This generates regularly temporally spaced bunches of electrons which are then accelerated to relativistic speed by the booster 29. The bunches of electrons output by the booster 29 are directed towards the accelerator module 22 of a particle accelerator. In this embodiment the particle accelerator comprises a single linear accelerator module 22. It will be appreciated that in other embodiments the particle accelerator may comprise more accelerator modules 22. Furthermore, this embodiment is a single pass arrangement wherein each bunch passes through the accelerator module 22 once to be accelerated and once to be decelerated (after passing through the undulator 24). It will be appreciated that alternative embodiments may be multiple pass arrangements wherein each bunch passes through one or more of the accelerator modules 22 more than once for acceleration and more than once for deceleration. Once it has been accelerated to a higher energy by the accelerator module 22, the bunched electron beam is directed to the undulator 24 via electron optics 31. In this embodiment the axes of the accelerator module 22 and the undulator 24 are generally parallel and the electron optics 31 are arranged to steer the bunched electron beam through an arcuate path such that its direction is rotated through 180°. It will be appreciated that while such an arrangement wherein the axes of the accelerator module 22 and the undulator 24 are generally parallel may be relatively compact arrangement for the layout of the free electron laser FEL other arrangements are possible. The electron optics 31 may also act as the bunch compressor 23. Alternatively, a separate bunch compressor (not shown) may be provided between electron optics 31 and the undulator 24.

As the bunched electron beam exits the undulator 24 it is directed back towards the accelerator module 22 via a second electron optics 32. The second electron optics 32 is also arranged to direct the bunched electron beam through an arcuate path such that its direction is rotated through 180°. It will be appreciated that when the accelerator module 22 is acting to decelerate electron bunches (which have previously passed through the undulator 24) it may be considered to be providing the functionality of the decelerator 26 shown in FIG. 3.

A merger 33 is provided proximate to an entrance to the accelerator module 22. The merger 33 is arranged to alternately direct bunches from the injector 21 and the second electron optics 32 towards the entrance to the accelerator module 22. The merger 33 comprises a first dipole magnet 33*a* that is arranged to receive bunches of electrons from both the injector 21 and the second electron optics 32 and to bend their trajectories. The bunches of electrons from the injector 21 and the second electron optics 32 approach the first dipole magnet along different trajectories. The bunches of electrons from the injector 21 may be considered to approach the accelerator module 22 along a first input path and the bunches of electrons from the second electron optics 32 may be considered to approach the accelerator module 22 along a second input path. The electrons from the second electron optics 32 have a higher energy than the electrons from the injector 21 and therefore the trajectory of the electrons from the second electron optics 32 is bent less than the trajectory of the electrons from the injector 21. The trajectories along which the electron bunches approach the first dipole magnet 33*a* from the second electron optics 32 and the injector 21 are arranged such that electron bunches from both the second electron optics 32 and the injector 21 pass into the accelerator module 22 along substantially the same trajectory. The merger 33 further comprises second and third dipole magnets 33*b*, 33*c* through which electrons from the second electron optics 32 pass. Together the first, second and third dipole magnets 33*a*, 33*b* and 33*c* form a magnetic chicane that is arranged to direct electron bunches from the second electron optics 32 to the accelerator module 22 with substantially no dispersion. The merger 33 further comprises a fourth dipole magnet 33*d* through which electrons from the injector 21 pass. Together the first and fourth dipole magnets 33*a* and 33*d* are arranged to direct electron bunches from the injector 21 to the accelerator module 22. It will be appreciated that alternative embodiments may comprise a merger which differs in specific form to that of the merger 33 shown in FIG. 4 and described above. For example, different numbers or arrangements of dipole magnets may alternatively be used.

Similarly, proximate to an exit of the accelerator module 22 a splitter 34 is provided. The splitter 34 is arranged to direct bunches of electrons exiting the accelerator module 22 alternatively towards electron optics 31 and the beam dump 27. In particular, the splitter 34 is arranged to direct those bunches which have been accelerated by the accelerator module 22 (i.e. their energy has been increased by the accelerator module 22) towards electron optics 31 and to direct electron bunches that had been decelerated by the accelerator module 22 (i.e. their energy has been reduced by the accelerator module 22) towards the beam dump 27. The splitter 34 comprises a first dipole magnet 34a that is arranged to receive bunches of electrons from the accelerator module 22 and to bend there trajectories. The electrons which have been accelerated by the accelerator module 22 have a higher energy than the electrons which have been deccelerated by the accelerator module 22. Therefore, the trajectory of the electrons which have been accelerated by the accelerator module 22 is bent less than the trajectory of the electrons which have been deccelerated by the accelerator module 22. The splitter 34 further comprises second and third dipole magnets 34b, 34c. The electrons which have been accelerated by the accelerator module 22 are directed towards the second and third dipole magnets 34b, 34c in turn. Together the first, second and third dipole magnets 34a, 34b and 34c form a magnetic chicane that is arranged to direct electron bunches from the accelerator module 22 to the electron optics 31 with substantially no dispersion. The splitter 34 further comprises a fourth dipole magnet 34d through which electrons which have been deccelerated by the accelerator module 22 pass. Together the first and fourth dipole magnets 34a and 34d are arranged to direct electron bunches which have been deccelerated by the accelerator module 22 to the beam dump 27. It will be appreciated that alternative embodiments may comprise a splitter which differs in specific form to that of the splitter 34 shown in FIG. 4 and described above. For example, different numbers or arrangements of dipole magnets may alternatively be used.

It will be appreciated that the free electron laser FEL shown in FIG. 4 forms an electron beam transport system. Furthermore, two different electron beams pass alternately through the accelerator module 22: the low energy electron beam provided by the injector 21, and the high energy beam from the second electron optics 32. The accelerator module 22 may be considered to be a main electron beam transport module, which defines a main path. The free electron laser FEL may be considered to comprise first and second input electron beam transport modules, each of the first and second input electron beam transport modules being arranged to deliver an electron beam to the accelerator module 22 (i.e. the main electron beam transport module).

Any combination of the elements of the FEL disposed between the injector 21 and the accelerator module 22 may be considered to form the first input electron beam transport module. The elements of the FEL disposed between the injector 21 and the accelerator module 22 that may be considered to form a first input electron beam transport module, either alone or in combination, include the first dipole magnet 33a and the fourth dipole magnet 33d of the merger 33. Any combination of the elements of the FEL disposed between the exit of the accelerator module 22 and the entrance to the accelerator module 22 may be considered to form a second input electron beam transport module. The elements of the FEL disposed between the exit of the accelerator module 22 and the entrance to the accelerator module 22 that may be considered to form a second input electron beam transport module, either alone or in combination, include the first, second and third dipole magnets 34a, 34b and 34c of the splitter 34, the electron optics 31, the undulator 24, the second electron optics 32 and the first, second and third dipole magnets 33a, 33b and 33c of the merger 33.

The radiation beam produced by a free electron laser typically has a relatively small etendue. In particular, the EUV radiation beam $B_{FEL}$ provided by the free electron laser FEL has a significantly smaller etendue than an EUV radiation beam that would be generated by a laser produced plasma (LPP) source or a discharge produced plasma (DPP) source (both of which are known in the prior art). For example, the radiation beam $B_{FEL}$ produced by the free electron laser FEL may have a divergence less than 500 μrad, for example less than 100 μrad, and may for example have a diameter of around 100 μm.

The output power of the free electron laser FEL may be of the order of tens of kilowatts, in order to support high throughput for one or more EUV lithographic apparatus. At these powers, since the initial diameter of the radiation beam $B_{FEL}$ produced by the free electron laser FEL is so small the power density will be significant. Therefore the beam delivery system BDS may comprise a radiation beam expander (not shown) that is arranged to increase the cross sectional area of the radiation beam $B_{FEL}$ produced by the free electron laser FEL. The radiation beam expander may be located a sufficient distance from the undulator 24 to allow the beam to expand to a size with a more acceptable power density. Since the divergence of the radiation beam $B_{FEL}$ produced by the free electron laser FEL is so small, a distance between the undulator 24 and the radiation beam expander may be of the order of tens, or even hundreds of metres. After such a distance, the radiation beam $B_{FEL}$ may have a diameter of the order of 1 mm.

Figure 5:
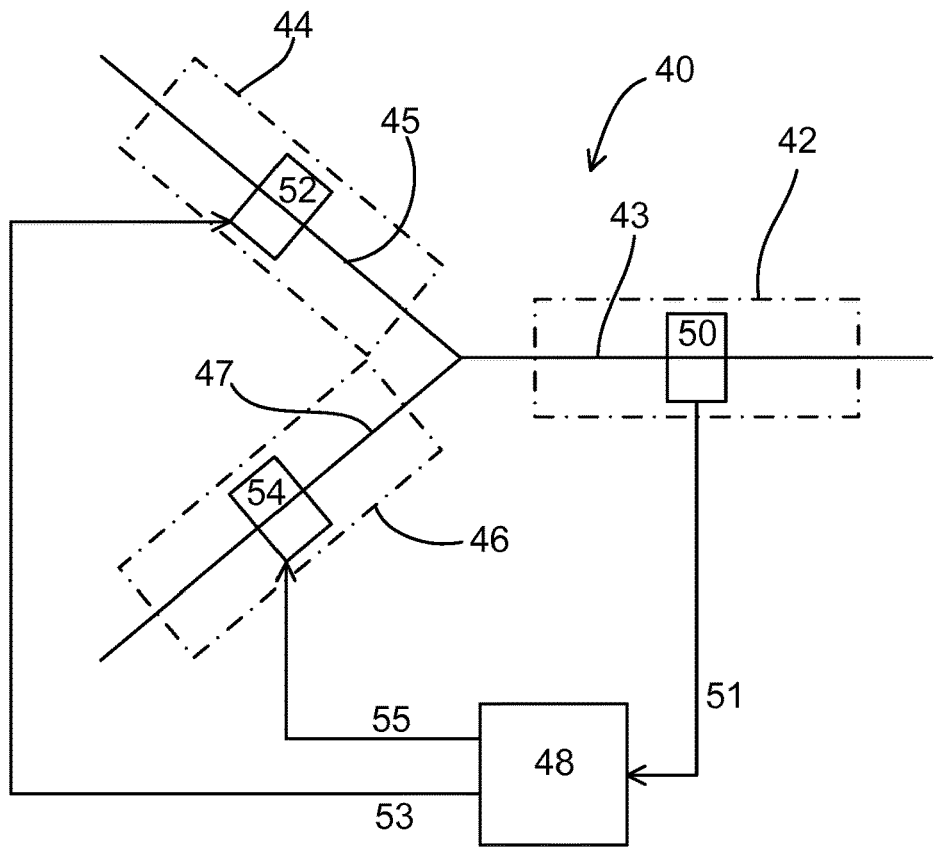
FIG. 5 is a schematic representation of an electron beam transport system for controlling the position of two different electron beams according to an embodiment of the invention.

FIG. 5 is a schematic representation of an electron beam transport system 40 for controlling the position of two different electron beams according to an embodiment of the invention. The electron beam transport system comprises a main electron beam transport module 42, a first input electron beam transport module 44, a second input electron beam transport module 46 and a controller 48.

The main electron beam transport module 42 defines a main path 43. The main electron beam transport module 42 comprises a beam monitoring device 50 disposed at a measurement position along the main path 43.

The first input electron beam transport module 44 defines a first input path 45. The first input electron beam transport module 44 is arranged to deliver a first electron beam to the main electron beam transport module 42. The first input electron beam transport module 44 comprises a first actuator 52 for applying a perturbation to a transverse position of the first electron beam at a first actuation point disposed along the first input path 45.

The second input electron beam transport module 46 defines a second input path 47. The second input electron beam transport module 46 is arranged to deliver a second electron beam to the main electron beam transport module 42. The second input electron beam transport module 46 comprises a second actuator 54 for applying a perturbation to a transverse position of the second electron beam at a second actuation point disposed along the second input path 47.

The first and second electron beams are bunched electron beams. The first input electron beam transport module 44 and the second input electron beam transport module 46 are arranged to alternately deliver the first and second electron beams to the main electron beam transport module 42 at substantially the same repetition rate or pulse frequency. Furthermore, the first input electron beam transport module 44 and the second input electron beam transport module 46 may be arranged such that within the main electron beam transport module 42 the first electron beam is approximately 180° out of phase with second electron beam. It will be appreciated that, in practice, the phase difference between the bunches of the first and second electron beams may not be 180° and may, for example, be up to of the order of 10° above or below 180° (i.e. between 170° and 190°).

The controller 48 is operable to receive a signal 51 from the beam monitoring device 50 and to send control signals 53, 55 to the first actuator 52 and the second actuator 54 respectively.

It will be appreciated that the main path 43, the first input path 45 and the second input path 47 are all under vacuum conditions. For example, each of the main path 43, the first input path 45 and the second input path 47 may be defined by an evacuated beam pipe. It will be appreciated that it is desirable for the first and second electron beams to be in the centre of the beam pipe. This may, for example, minimise losses due to wakefields.

Figure 6:
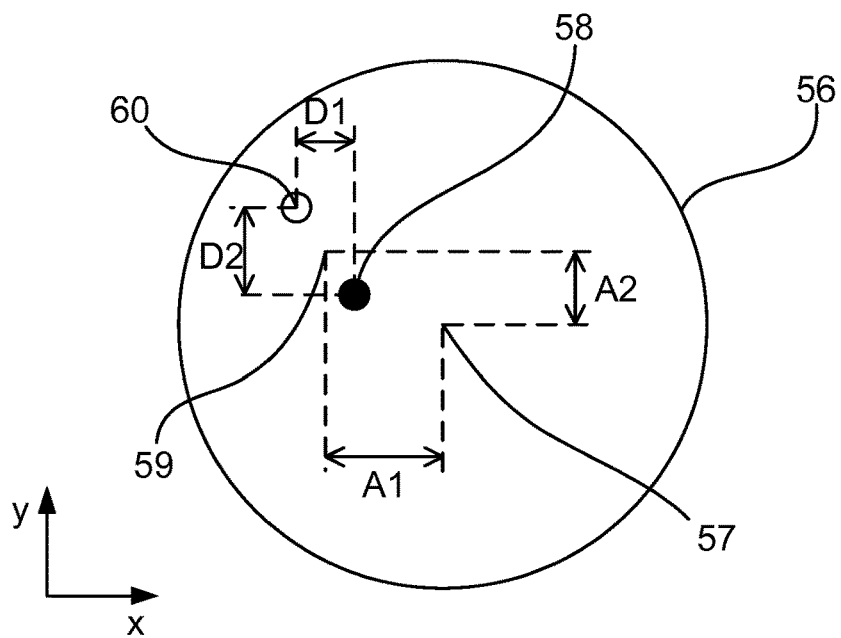
FIG. 6 shows a cross section of a beam pipe and the transverse positions of the first and second electron beams.

FIG. 6 shows a cross section of a beam pipe 56 which defines the main path 43. Although the beam pipe 56 shown in FIG. 6 is circular, it will be appreciated that in alternative embodiments, the beam pipes may have different shapes, for example the beam pipe may be elliptical in cross section. Also shown are the transverse positions of the first and second electron beams 58, 60.

It is desirable to monitor the transverse position of each of the first and second electron beams and provide a feedback loop using the first and second actuators 53, 54 that both of the first and second electron beams 58, 60 are maintained at, or close to, the center 57 of the beam pipe 56. However, under certain operating conditions, the beam monitoring device 50 may not be able to temporally resolve the position of the first and second electron beams independently.

The electron beam transport system 40 may form part of a free electron laser FEL that incorporates an energy recovering linear accelerator such as that shown in FIG. 4. The main electron beam transport module 42 may be the accelerator module 22 or a part thereof.

The first input electron beam transport module 44 may be any combination of the elements of the FEL disposed between the injector 21 and the accelerator module 22, i.e. the first dipole magnet 33a and the fourth dipole magnet 33d of the merger 33. The first actuator 52 may comprise any combination of these elements that can be used to alter a transverse position of the first electron beam at the first actuation point, for example by varying, or applying a perturbation to, a current supplied to said element. Additionally or alternatively, the first actuator 52 may comprise one or more additional elements that can be used to alter a transverse position of the first electron beam at the first actuation point, for example by varying, or applying a perturbation to, a current supplied to said element.

The second input electron beam transport module 46 may be any combination of the elements of the FEL disposed between between the exit of the accelerator module 22 and the entrance to the accelerator module 22, i.e. the first, second and third dipole magnets 34a, 34b and 34c of the splitter 34, the electron optics 31, the undulator 24, the second electron optics 32 and the first, second and third dipole magnets 33a, 33b and 33c of the merger 33. The second actuator 54 may comprise any combination of these elements that can be used to alter a transverse position of the first electron beam at the first actuation point, for example by varying, or applying a perturbation to, a current supplied to said element. Additionally or alternatively, the second actuator 54 may comprise one or more additional elements that can be used to alter a transverse position of the first electron beam at the first actuation point, for example by varying, or applying a perturbation to, a current supplied to said element.

Each of the first electron beam (which is accelerated by the accelerator module 22) and the second electron beam (which is decelerated by the accelerator module 22) may have a pulse frequency $f_0$ of the order of 100 MHz or higher. In some arrangements, the first electron beam and the second electron beam may have a pulse frequency $f_0$ of the order of 1 GHz or higher. The temporal extent $t_p$ of each of the first and second electron beams may be of the order of 0.1 to 10 ps. If it was desired for the beam monitoring device 50 to temporally resolve the position of the first and second electron beams separately, i.e. to determine a separate transverse position for each bunch, then the beam monitoring device 50 would need to have a data acquisition frequency of $2f_0$. This may be complex and expensive to implement for sufficiently high pulse frequencies $f_0$. It will be appreciated that the higher the pulse frequency $f_0$, the more challenging it is to temporally resolve the position of the first and second electron beams. Conventional beam position measurement systems may be unable to separately determine the position for each electron bunch energy level and may instead deliver an average bunch position for all bunches.

The controller 48 or the beam monitoring device 50 is operable to determine a first quantity and a second quantity. As now explained, the first quantity is indicative of a difference in a transverse position of the first and second electron beams 58, 60 at the measurement point and the second quantity is indicative of an average transverse position of the first and second electron beams 58, 60 at the measurement point. In particular, the average transverse position of the first and second electron beams 58, 60 at the measurement point may be a difference in a transverse position of the average position 59 of the first and second electron beams 58, 60 at the measurement point and a reference position, for example the center 57 of the beam pipe 56.

In the following, the term control direction may refer to a direction (for example the x direction or y direction), in the plane transverse to the path of the electron beams, in which the position of the electron beams is being controlled. It will be appreciated that the first quantity is indicative of a difference in a transverse position of the first and second electron beams 58, 60 at the measurement point in a control direction and that the second quantity is indicative of an average transverse position of the first and second electron beams 58, 60 at the measurement point in the control direction first direction. The control direction is a direction in a plane perpendicular to the trajectory of the electron beams. The propagation direction of the electron beams at any given point within the electron beam transport system 40 may be referred to as the z direction. With this convention, the control direction is a direction in the x-y plane. For example the control direction may be the x direction or the y direction. As will be described below, the first quantity and the second quantity are used as control parameters in control loops so as to adjust the transverse position of the first and second electron beams in the control direction. In order to full control the transverse position of the first and second electron beams independent control loops are implemented in each of two control directions. By convention these control directions are mutually perpendicular and may be referred to as the x direction and y direction.

For control in a first of the control directions, the first quantity may be indicative of a first difference D1 in a transverse position of the first and second electron beams 58, 60 at the measurement point in a first control direction (which may be referred to as the x direction, see FIG. 6) and the second quantity may be indicative of a first average transverse position A1 of the first and second electron beams 58, 60 at the measurement point in the first direction. For control in a first of the control directions, the first quantity may be indicative of a second difference D2 in a transverse position of the first and second electron beams 58, 60 at the measurement point in a second control direction (which may be referred to as the y direction, see FIG. 6) and the second quantity may be indicative of a second average transverse position A2 of the first and second electron beams 58, 60 at the measurement point in the second control direction.

The beam monitoring device 50 disposed at a measurement position along the main path 43 comprises a beam position monitor, as now described with reference to FIG. 7.

Figure 7:
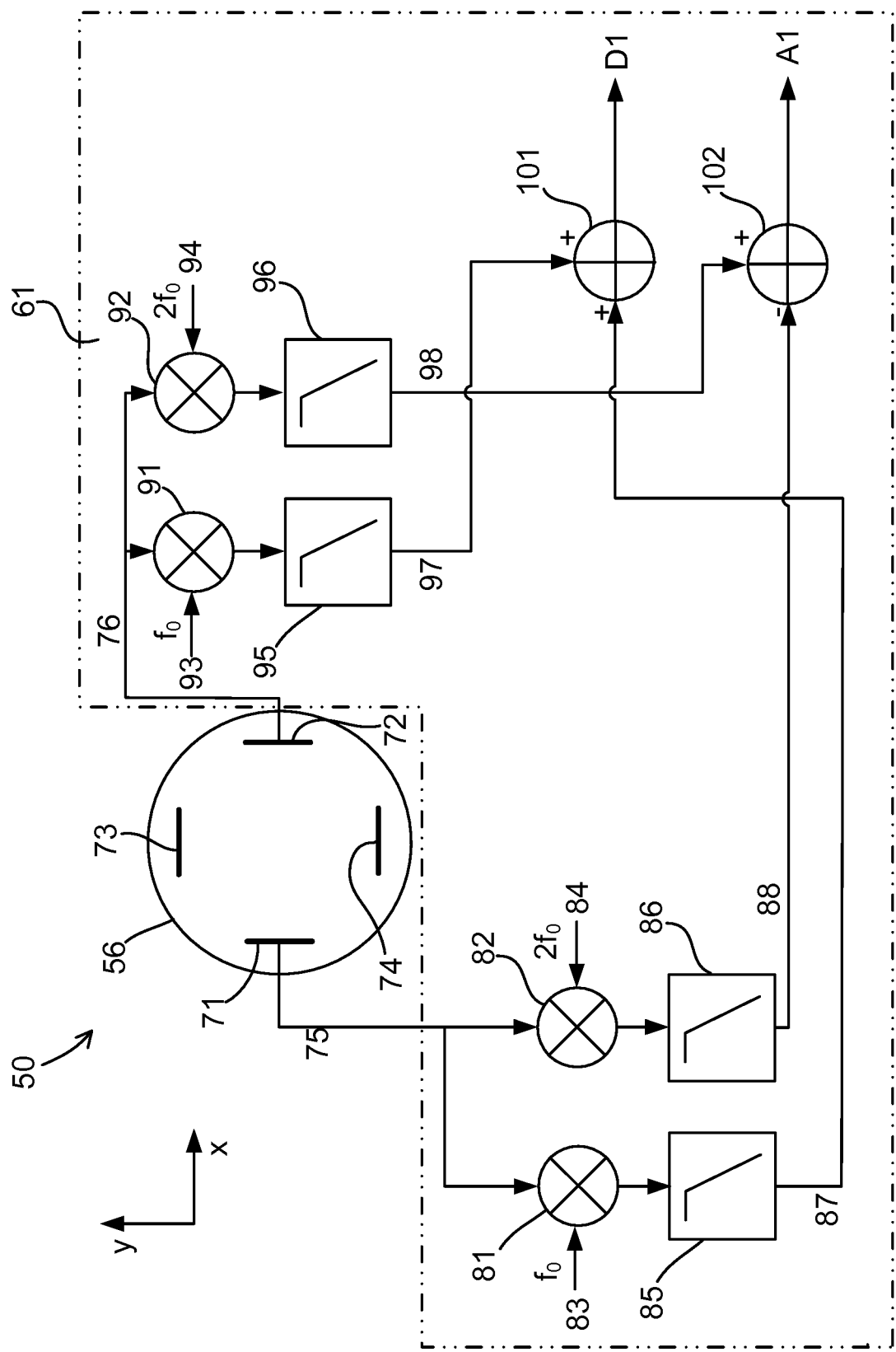
FIG. 7 shows, schematically, a beam monitoring device, including a data acquisition system, that may form part of the electron beam transport system shown in FIG. 5.

The beam monitoring device 50 shown in FIG. 7 comprises a first pair of electrodes 71, 72, each of the first pair of electrodes 71, 72 being formed from a conductive material. The first pair of electrodes 71, 72 are generally mutually parallel and are separated in the first control direction (x direction in FIG. 7). The first pair of electrodes 71, 72 are provided on opposite sides of, and equidistant from, the center 57 of the beam pipe 56. Each of the first pair of electrodes 71, 72 may be generally of the form of a conductive plate and the first pair of electrodes 71, 72 may be generally mutually parallel.

The beam monitoring device 50 further comprises a second pair of electrodes 73, 74, each of the pair of electrodes 73, 74 being formed from a conductive material. The second pair of electrodes 73, 74 are generally mutually parallel and are separated in the second control direction (y direction in FIG. 7), the second control direction being perpendicular to the first control direction. The second pair of electrodes 73, 74 are provided on opposite sides of, and equidistant from, the center 57 of the beam pipe 56. Each of the second pair of electrodes 73, 74 may be generally of the form of a conductive plate and the second pair of electrodes 73, 74 may be generally mutually parallel.

As an electron beam passes through the beam monitoring device 50, charges are induced on the first and second pairs of electrodes 71, 72 and 73, 74.

On a conventional beam position monitor system an average transverse position of the electron beam in the first direction can be determined by measuring the difference on the first pair of electrodes 71, 72. Similarly, an average transverse position of the electron beam in the second direction can be determined by measuring the difference on the second pair of electrodes 73, 74.

As explained above, the beam monitoring device 50 is disposed at the measurement location on the main electron beam transport module 42, which alternately receives bunches of electrons from the first input electron beam (from the first input electron beam transport module 44) and the second input electron beam (from the second input electron beam transport module 46). Each of the first and second input electron beams has a pulse frequency of $f_0$. Furthermore, the first electron beam is approximately 180° out of phase with second electron beam. That is, the time interval from each bunch of the first electron beam passing the measurement point to the subsequent bunch of the second electron beam passing the measurement point is substantially equal to the time interval from each bunch of the second electron beam passing the measurement point to the subsequent bunch of the first electron beam passing the measurement point. When the first and second electron bunches are at the same transverse position in one of the x direction or the y direction a frequency component of $2f_0$, and higher harmonics of this frequency, is present in the signal received by the first or second pair of electrodes 71, 72 and 73, 74 respectively. When there is a difference in the transverse position in the x direction or the y direction then, in addition, a spectral component at a frequency of $f_0$ will also be generated in the signal received by the first or second pair of electrodes 71, 72 and 73, 74 respectively.

The $f_0$ and $2f_0$ spectral components of the signals output by the first and second pairs of electrodes 71, 72 and 73, 74 can therefore be used by the beam monitoring device 50 (or, alternatively, the controller 48) to determine the first quantity and the second quantity in the first and second control directions respectively.

The $f_0$ spectral component of the signals output by the first and second pairs of electrodes 71, 72 and 73, 74 can be used to determine the first quantity, which is indicative of a difference in a transverse position of the first and second electron beams 58, 60 at the measurement point. In particular, the $f_0$ spectral component of the signals output by the first pair of electrodes 71, 72 can be used to determine a difference D1 in the transverse position of the first and second electron beams 58, 60 in the first control direction (x direction) at the measurement point and the $f_0$ spectral component of the signals output by the second pair of electrodes 73, 74 can be used to determine a difference D2 in the transverse position of the first and second electron beams 58, 60 in the second control direction (y direction) at the measurement point.

The $2f_0$ spectral component of the signals output by the first and second pairs of electrodes 71, 72 and 73, 74 can be used to determine the second quantity, which is indicative of an average transverse position of the first and second electron beams 58, 60 at the measurement point. In particular, the $2f_0$ spectral component of the signals output by the first pair of electrodes 71, 72 can be used to determine an average transverse position A1 of the first and second electron beams 58, 60 in the first control direction (x direction) at the measurement point and the $2f_0$ spectral component of the signals output by the second pair of electrodes 73, 74 can be used to determine an average transverse position A2 of the first and second electron beams 58, 60 in the second control direction (y direction) at the measurement point.

The beam monitoring device 50 further comprises a data acquisition system 61 which is operable to determine the differences D1, D2 in the transverse position of the first and second electron beams 58, 60 in the x and y directions and the average transverse positions A1, A2 of the first and second electron beams 58, 60 in the x and y directions at the measurement point. In FIG. 7, for clarity reasons only the portion of the data acquisition system 61 that is used to determine the difference D1 in the transverse position of the first and second electron beams 58, 60 and the average transverse position A1 of the first and second electron beams 58, 60 in the x direction is shown. It will be appreciated that, although not shown in FIG. 7, the data acquisition system 61 further comprises additional components that are used to determine the difference D2 in the transverse position of the first and second electron beams 58, 60 and the average transverse position A2 of the first and second electron beams 58, 60 in the y direction.

In the present embodiment, the data acquisition system 61 is operable to determine the $f_0$ and $2f_0$ spectral components of the signals output by the first and second pairs of electrodes 71, 72 and 73, 74 using synchronous detection, as now described. It will of course be appreciated that in alternative embodiments any other signal processing method that allows the $f_0$ and $2f_0$ spectral components of the signals output by the first and second pairs of electrodes 71, 72 and 73, 74 to be determined may be used. Such alternative signal processing methods may, for example use a lock-in amplifier.

Each of the first pair of electrodes 71, 72 outputs a signal 75, 76, which is received by the data acquisition system 61. This pair of signals 75, 76 is then processed to determine: a difference D1 in the transverse position of the first and second electron beams 58, 60 in the x direction and an average transverse position A1 of the first and second electron beams 58, 60 in the x direction and at the measurement point, as will now be described. Similarly, each of the second pair of electrodes 73, 74 outputs a signal (not shown), which is received by the data acquisition system 61. This pair of signals is then processed in the same way as the pair of signals 75, 76 output by the first pair of electrodes 71, 72 to determine: a difference D2 in the transverse position of the first and second electron beams 58, 60 in the y direction and an average transverse position A2 of the first and second electron beams 58, 60 in the y direction and at the measurement point. For simplicity only the processing of the pair of signals 75, 76 output by the first pair of electrodes 71, 72 is described below.

In this embodiment, the data acquisition system 61 forms part of the beam monitoring device 50. It will be appreciated that, in this embodiment, the signal 51 received by the controller 48 from the beam monitoring device 50 (see FIG. 5) may comprise the differences D1, D2 in the transverse position of the first and second electron beams 58, 60 in the x and y directions and the average transverse positions A1, A2 of the first and second electron beams 58, 60 in the x and y directions at the measurement point.

In alternative embodiments, the data acquisition system 61 may form part of the controller 48. It will be appreciated that, in such alternative embodiments, the signal 51 received by the controller 48 from the beam monitoring device 50 (see FIG. 5) may comprise the pair of signals 75, 76 output by the first pair of electrodes 71, 72 and the pair of signals output by the second pair of electrodes 73, 74.

The first pair of electrodes comprises a first electrode 71 and a second electrode 72.

The signal 75 output by the first electrode 71 is input into first and second frequency mixers 81, 82. The first frequency mixer 81 receives a reference frequency 83 of $f_0$. The second frequency mixer 82 receives a reference frequency 84 of $2f_0$. The output of the first frequency mixer 81 is input into a first low pass filter 85 and the output of the second frequency mixer 82 is input into a second low pass filter 86.

The first low pass filter 85 is arranged to pass a relatively narrow band of frequencies such that a signal 87 output by the first low pass filter 85 is proportional to the $f_0$ spectral component of the signal 75 output by the first electrode 71. The second low pass filter 86 is arranged to pass a relatively narrow band of frequencies such that a signal 88 output by the second low pass filter 86 is proportional to the $2f_0$ spectral component of the signal 75 output by the first electrode 71.

The signal 76 output by the second electrode 72 is input into third and fourth frequency mixers 91, 92. The third frequency mixer 91 receives a reference frequency 93 of $f_0$. The fourth frequency mixer 92 receives a reference frequency 94 of $2f_0$. The output of the third frequency mixer 91 is input into a third low pass filter 95 and the output of the fourth frequency mixer 92 is input into a fourth low pass filter 96.

The third low pass filter 95 is arranged to pass a relatively narrow band of frequencies such that a signal 97 output by the third low pass filter 95 is proportional to the $f_0$ spectral component of the signal 76 output by the second electrode 72. The fourth low pass filter 96 is arranged to pass a relatively narrow band of frequencies such that a signal 98 output by the fourth low pass filter 96 is proportional to the $2f_0$ spectral component of the signal 76 output by the second electrode 72.

The data acquisition system 61 further comprises two adders 101, 102. It will be appreciated that in this context an adder (also referred to as a summer) is a circuit that is operable to find the sum or difference between two input signals.

The pair of signals 75, 76 induced in the first pair of electrodes 71, 72 are mixed down to baseband using the first and third mixers 81, 91 which operate with a reference frequency 83, 93 of $f_0$ (the repetition frequency of each of the electron beams through the common main path 43). The first adder 101 is arranged to determine a sum of the two signals 87, 97 output by the first and second low pass filters 85, 95 respectively. The signal D1 output by the first adder 101 is proportional to a difference D1 in the transverse position of the first and second electron beams 58, 60 in the x direction at the measurement point.

Note that the signal D1 output by the first adder 101 is the modulus of the difference D1 in the transverse position of the first and second electron beams 58, 60 in the x direction and therefore is always positive. As a result, the signal D1 is minimal when first and second input electron beams are at the same transverse x position.

The pair of signals 75, 76 induced in the first pair of electrodes 71, 72 are mixed down to baseband using the second and fourth mixers 82, 92 which operate with a reference frequency 84, 94 of $2f_0$ (i.e. the total repetition frequency of electron beams through the common main path 43). The second adder 102 is arranged to determine a difference in the two signals 88, 98 output by the second and fourth low pass filters 86, 96 respectively. This difference in the two signals 88, 98 output by the second and fourth low pass filters 86, 96 is indicative of the average transverse position A1 of the first and second electron beams 58, 60 in the x direction at the measurement point. If the total charge of bunches in the first electron beam is substantially equal to the total charge of bunches in the second electron beam then the difference in the two signals 88, 98 output by the second and fourth low pass filters 86, 96 is proportional to the average transverse position A1 of the first and second electron beams 58, 60 in the x direction at the measurement point and may be output directly by the data acquisition system 61. If there is a difference in the total charge of the bunches in the first and second electron beams then the average transverse position A1 of the first and second electron beams 58, 60 in the x direction at the measurement point may be proportional to the difference in the two signals 88, 98 output by the second and fourth low pass filters 86, 96 when normalised to the sum of the two signals 88, 98 output by the second and fourth low pass filters 86, 96. Therefore, optionally, the data acquisition system 61 may further comprise a third adder (not shown) arranged to determine a sum of the two signals 88, 98 output by the second and fourth low pass filters 86, 96 and a divider (not shown) arranged to divide the output of the second adder 102 by the third adder. For such embodiments, the output of the divider may be output by the data acquisition system 61.

The resultant signal A1 is proportional to an average transverse position A1 of the first and second electron beams 58, 60 in the x direction at the measurement point. A1=0 corresponds to the average transverse position of the first and second electron beams 58, 60 being in the centre of the beam pipe 56 (in the x direction), A1<0 corresponds to the average transverse position of the first and second electron beams 58, 60 at a negative x position (i.e. to the left of the centre of the beam pipe 56 in FIG. 6), and A1>0 corresponds to the average transverse position of the first and second electron beams 58, 60 at a positive x position (i.e. to the right of the centre of the beam pipe 56 in FIG. 6).

The controller 48 is operable to control the trajectories of the first and second electron beams using the first and second actuators 52, 54 via control signals 53, 55. As will be described below, the controller 48 is operable to independently control the trajectories of the first and second electron beams by implementing a first control loop and a second control loop (for each of the first and second control directions). The first control loop iteratively attempts to reduce the first quantity (which is indicative of a difference in a transverse position of the two different electron beams at a measurement point along the common main path 43) by using the first actuator 52 to perturb a trajectory of the first electron beam. The second control loop iteratively perturbs a trajectory of the second electron beam using the second actuator 54 such that the average transverse position of the two different electron beams moves towards a desired transverse position (for example the centre 57 of the beam pipe 56).

As explained above, in order to fully control the transverse position of the first and second electron beams independent control loops are implemented in each of two control directions, i.e. the x direction and the y direction. For control in the x direction, two control parameters are used: the first quantity which is indicative of a first difference D1 in a transverse position of the first and second electron beams 58, 60 at the measurement point in the x direction and the second quantity which is indicative of a first average transverse position A1 of the first and second electron beams 58, 60 at the measurement point in the x direction. For control in the y direction, two control parameters are used: the first quantity which is indicative of a second difference D2 in a transverse position of the first and second electron beams 58, 60 at the measurement point in the y direction and the second quantity which is indicative of a second average transverse position A2 of the first and second electron beams 58, 60 at the measurement point in the y direction.

The first and second actuators 52, 54 may be operable to independently control the transverse position of the first and second electron beams in both the x direction and the y direction.

The controller 48 is operable to implement a first and second control loop for the x direction and, independently, a first and second control loop for the y direction. The first control loop for the x direction iteratively attempts to reduce a difference D1 in a transverse position of the two different electron beams at a measurement point along the common main path 43 in the x direction. The second control loop for the x direction iteratively perturbs a trajectory of the second electron beam in the x direction using the second actuator 54 such that the average transverse position of the two different electron beams in the x direction moves towards a desired transverse position (for example the centre 57 of the beam pipe 56). The first control loop for the y direction iteratively attempts to reduce a difference D2 in a transverse position of the two different electron beams at a measurement point along the common main path 43 in the y direction. The second control loop for the y direction iteratively perturbs a trajectory of the second electron beam in the y direction using the second actuator 54 such that the average transverse position of the two different electron beams in the y direction moves towards a desired transverse position (for example the centre 57 of the beam pipe 56).

In the following description, the control loops used to control the positions of the first and second electron beams in the x direction will be described. It will be appreciated that the control loops used to control the positions of the first and second electron beams in the y direction operate in the same way.

Figure 8:
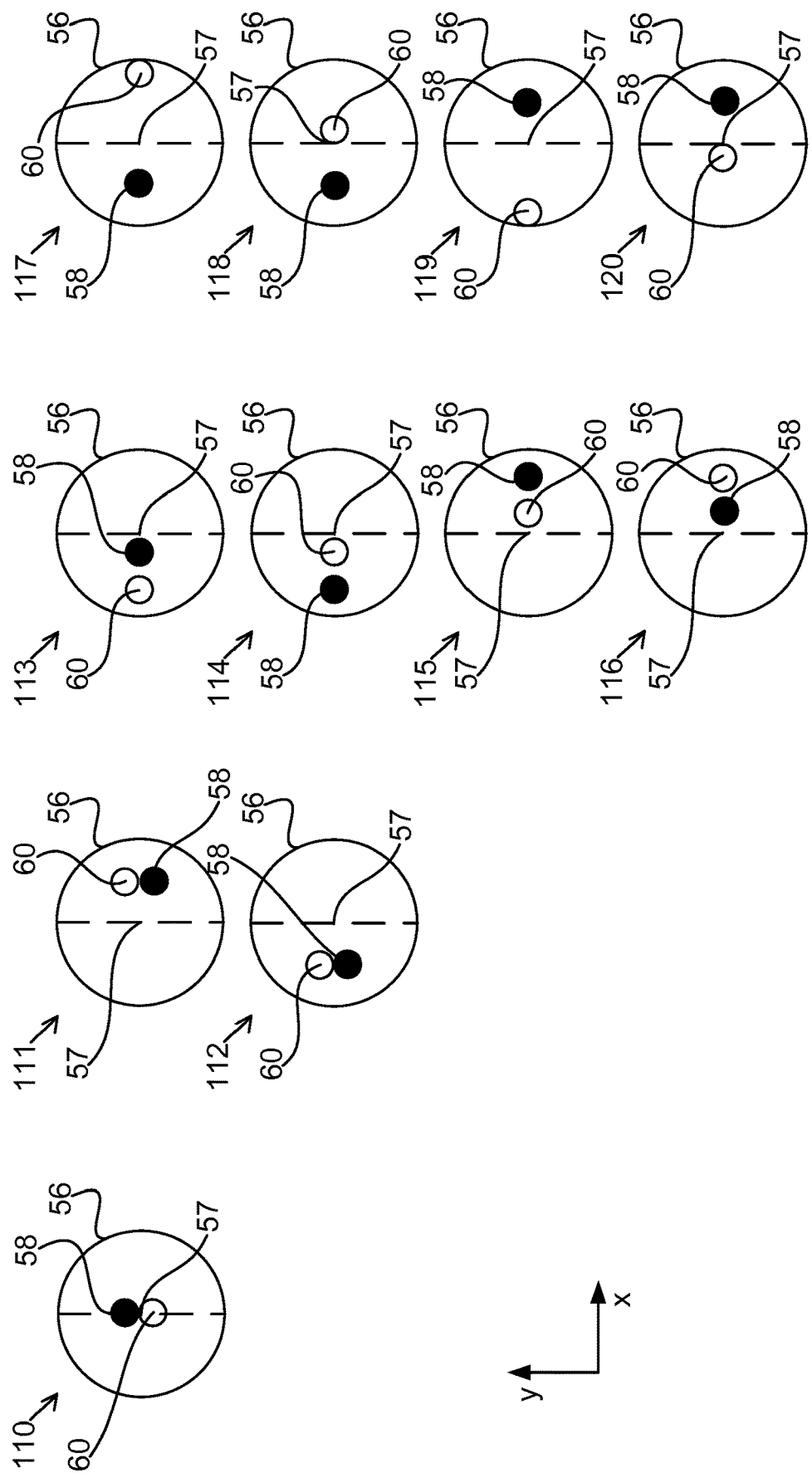
FIG. 8 shows 11 different configurations that the two electron beams can disposed in relative to each other.

In the x direction, the two electron beams can disposed relative to each other in 11 different configurations, as now described with reference to FIG. 8.

In the first three configurations 110, 111, 112, the first and second electron beams 58, 60 are disposed at the same x position (i.e. D1=0). In a first one of these configurations 110 the first and second electron beams 58, 60 are both disposed at the center 57 of the beam pipe 56 (i.e. A1=0). In a second one of these configurations 111 the first and second electron beams 58, 60 are both disposed on a first side of the center 57 of the beam pipe 56 and in a third one of these configurations 112 the first and second electron beams 58, 60 are both disposed on a second, opposite side of the center 57 of the beam pipe 56.

In the remaining eight configurations 113-120, the first and second electron beams 58, 60 are disposed at different x positions (i.e. D1>0).

In four of the configurations 113, 114, 118, 119 in which the first and second electron beams 58, 60 are disposed at different x positions, the average x position A1 of the first and second electron beams 58, 60 is on a first side of the center 57 of the beam pipe 56. In two of these configurations 113, 114 the first and second electron beams 58, 60 are on the same side of the center 57 of the beam pipe 56 whereas in two of these configurations 118, 119 the first and second electron beams 58, 60 are on opposite sides of the center 57 of the beam pipe 56.

In a different four of the configurations 115, 116, 117, 120 in which the first and second electron beams 58, 60 are disposed at different x positions, the average x position A1 of the first and second electron beams 58, 60 is on a second, opposite side of the center 57 of the beam pipe 56. In two of these configurations 115, 116 the first and second electron beams 58, 60 are on the same side of the center 57 of the beam pipe 56 whereas in two of these configurations 117, 120 the first and second electron beams 58, 60 are on opposite sides of the center 57 of the beam pipe 56.

The two control loops implemented by the controller 48 are now described with reference to FIGS. 9 and 10.

Figure 9:
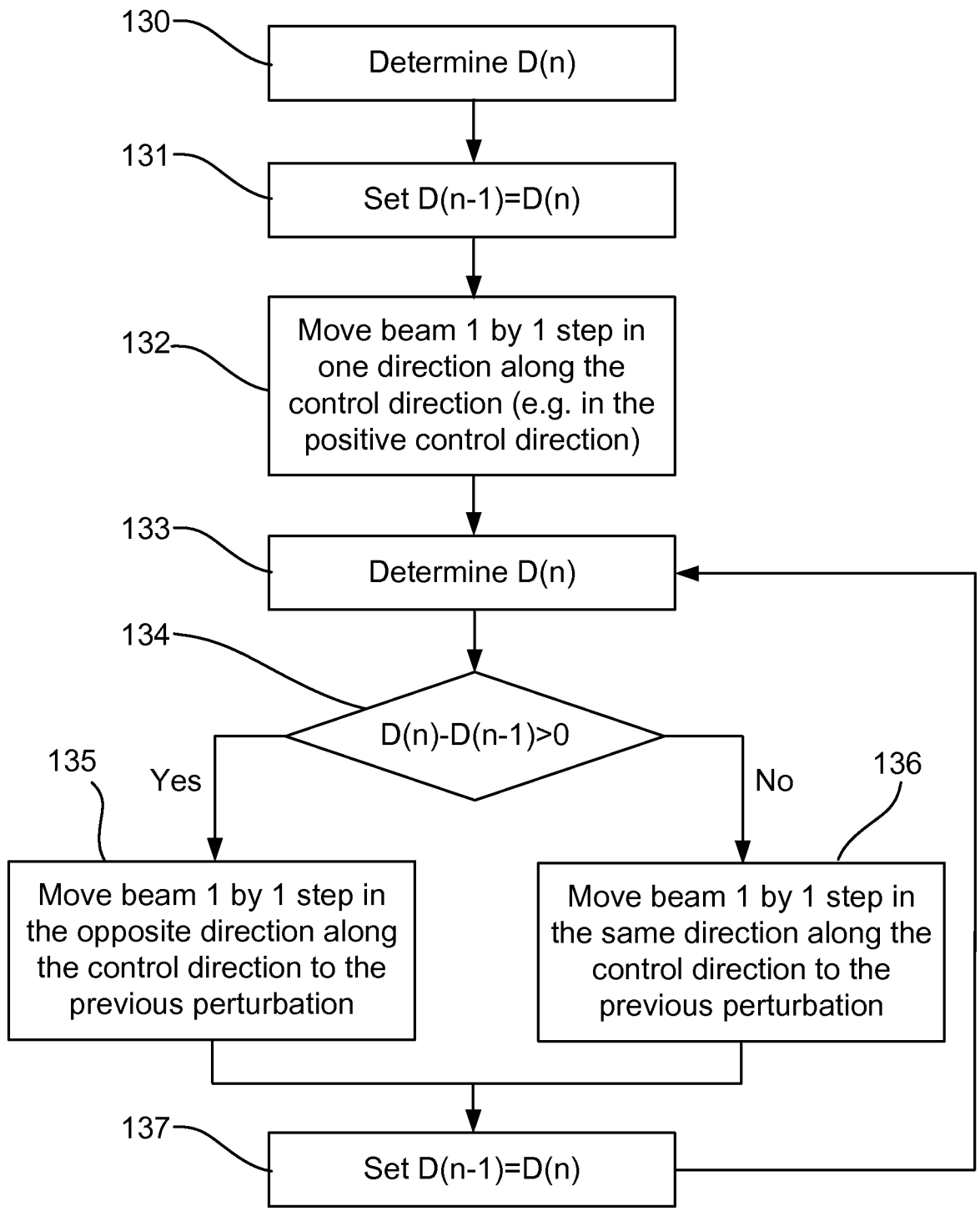
FIG. 9 is a flow chart for a first control loop implemented by the controller the electron beam transport system shown in FIG. 5.

A flow chart for the first control loop implemented by the controller 48 is shown in FIG. 9.

As an initial step 130, D(n) is determined. It will be appreciated in the following that D(n) is intended to be the value of the control parameter D at a current iteration in the control loop and D(n−1) is intended to be the value of the control parameter D at a previous iteration in the control loop. It will be appreciated that the control parameter D may represent the difference D1 in a transverse position of the two different electron beams at a measurement point along the common main path 43 in the x direction (when the control direction is the x direction) or a difference D2 in a transverse position of the two different electron beams at a measurement point along the common main path 43 in the y direction (when the control direction is the y direction).

Once D(n) has been determined, at step 131, D(n−1) is set equal to this initial value of D(n).

Next, at step 132 a perturbation is applied to the transverse position of the first electron beam at the first actuation point using the first actuator 52. This is achieved by an appropriate control signal 53 being generated by the controller 48 and sent to the first actuator 52. The first actuator 52 may be operable to control the transverse position of the first electron beam by moving the transverse position of the first electron beam through one or more discrete steps in the control direction. At step 132, the first actuator 52 is used to move the first electron beam by one step in one direction along the control direction, for example the positive control direction. It will be appreciated that movement along one direction along the control direction is intended to mean movement in either the positive control direction or in the negative control direction. If the control direction is the x direction then movement in the positive x direction increases x and movement in the negative control direction decreases x. The positive control direction may be referred to as the "right" when the control direction is the x direction or may be referred to as "up" when the control direction is the y direction. The negative control direction may be referred to as the "left" when the control direction is the x direction or may be referred to as "down" when the control direction is the y direction.

Following this perturbation, at step 133, D(n) is determined. At step 134 this determined value of the control parameter D(n) is compared to the previous value of the control parameter.

If D(n)−D(n−1)>0 then the value of the control parameter has increased. It will be recalled that the control parameter D, or first quantity, is indicative of a difference in a transverse position of the two different electron beams at a measurement point along the common main path 43. It is therefore desirable to minimise the control parameter D. Therefore, if D(n)−D(n−1)>0 then, at step 135, a subsequent perturbation is applied to the transverse position of the first electron beam at the first actuation point using the first actuator 52, the subsequent perturbation being in an opposite direction to the previous perturbation applied to the transverse position of the first electron beam. The first actuator 52 is used to move the first electron beam by one step in the opposite direction along the control direction to the previous perturbation. For example, if the previous perturbation applied was to move the first electron beam in the positive control direction (for example to the right or up) then the subsequent perturbation may be to move the first electron beam in the negative control direction (for example to the left or down).

If D(n)−D(n−1)<0 then the value of the control parameter has decreased. If D(n)−D(n−1)<0 then, at step 136, a subsequent perturbation is applied to the transverse position of the first electron beam at the first actuation point using the first actuator 52, the subsequent perturbation being in the same direction as the previous perturbation applied to the transverse position of the first electron beam. The first actuator 52 is used to move the first electron beam by one step in the same direction along the control direction to the previous perturbation. For example, if the previous perturbation applied was to move the first electron beam in the positive control direction (for example to the right or up) then the subsequent perturbation may be to move the first electron beam in the positive control direction by another step.

At step 137, D(n−1) is set equal to the current value of D(n) and the control loop returns to step 133.

Figure 10:
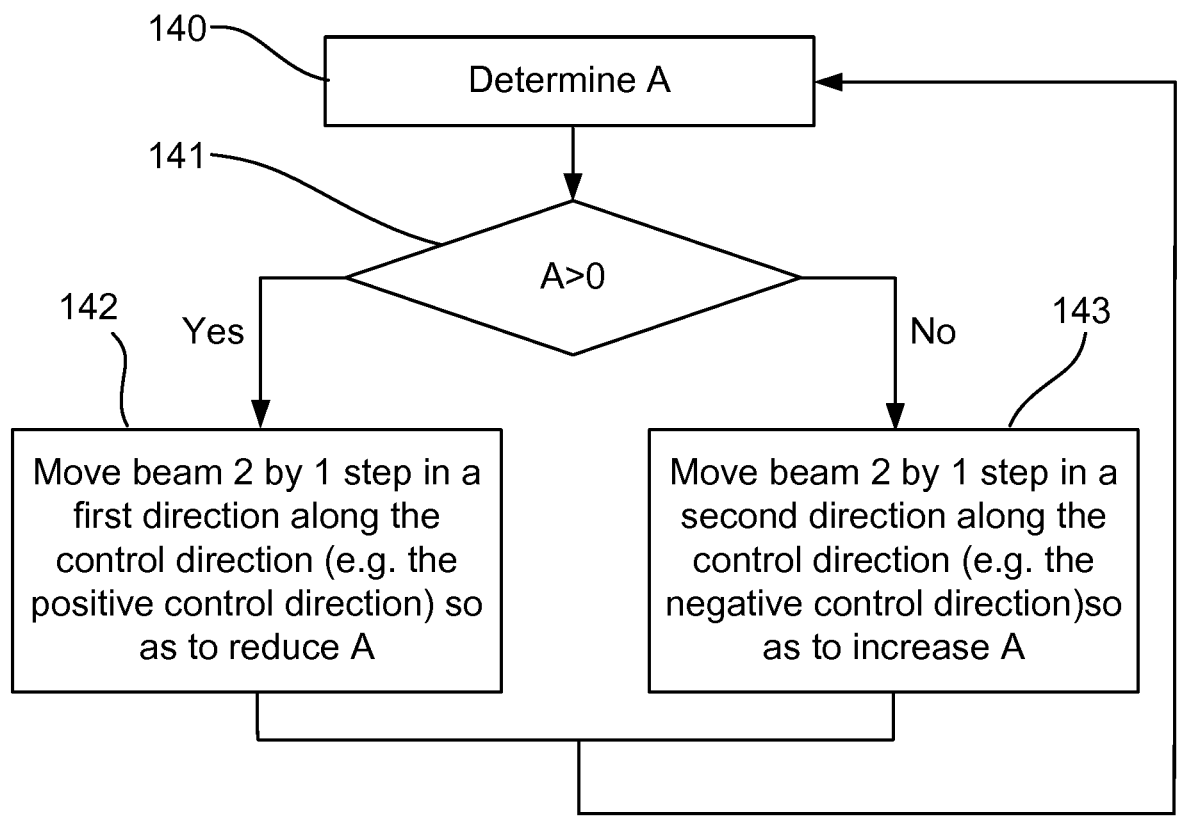
FIG. 10 is a flow chart for a second control loop implemented by the controller the electron beam transport system shown in FIG. 5.

A flow chart for the second control loop implemented by the controller 48 is shown in FIG. 10.

As an initial step 140, a control parameter A is determined. It will be appreciated that the control parameter A may represent the average transverse position A1 of the first and second electron beams 58, 60 at the measurement point in a first direction (which may be referred to as the x direction) or the average transverse position A2 of the first and second electron beams 58, 60 at the measurement point in a second direction (which may be referred to as the y direction).

Once A has been determined, at step 141 this determined value of the control parameter A is compared to a reference value that corresponds to a desired position of the first and second electron beams. As explained above, in the present embodiment, A1=0 corresponds to the average transverse position of the first and second electron beams 58, 60 being in the centre of the beam pipe 56 (in the x direction). Similarly, A2=0 corresponds to the average transverse position of the first and second electron beams 58, 60 being in the centre of the beam pipe 56 (in they direction). Therefore, as shown in FIG. 10, the reference value may for example be 0.

If A is greater than the reference value (for example A>0) then the average transverse position of the first and second electron beams is on a first side of the desired position (for example the centre 57 of the beam pipe 56). Therefore, if A is greater than the reference value (for example A>0) then, at step 142, a perturbation is applied to the transverse position of the second electron beam at the second actuation point using the second actuator 54 to move the second electron beam in the a first direction along the control direction so as to reduce A. As explained above, in the present embodiment A1>0 corresponds to the average transverse position of the first and second electron beams 58, 60 at a positive x position (i.e. to the right of the centre of the beam pipe 56 in FIG. 6). Therefore, in this embodiment, at step 142 the perturbation applied to the transverse position of the second electron beam at the second actuation point using the second actuator 54 moves the second electron beam in the negative control direction (for example to the left or down).

If A is less than the reference value (for example A<0) then the average transverse position of the first and second electron beams is on a second side of the desired position (for example the centre 57 of the beam pipe 56). Therefore, if A is less than the reference value (for example A<0) then, at step 143, a perturbation is applied to the transverse position of the second electron beam at the second actuation point using the second actuator 54 to move the second electron beam in a second direction along the control direction so as to reduce A. As explained above, in the present embodiment A1<0 corresponds to the average transverse position of the first and second electron beams 58, 60 at a negative x position (i.e. to the left of the centre of the beam pipe 56 in FIG. 6). Therefore, in this embodiment, at step 142 the perturbation applied to the transverse position of the second electron beam at the second actuation point using the second actuator 54 moves the second electron beam in the positive control direction (for example to the right or up).

Following step 142 or 143, the control loop returns to step 140.

The second control loop described above iteratively perturbs a trajectory of the second electron beam in the control direction using the second actuator 54 such that the average transverse position of the two different electron beams in the control direction moves towards a desired transverse position (for example the centre 57 of the beam pipe 56).

The method that the controller 48 is operable to implement, as explained above, is advantageous for a number of reasons, as now explained. The method allows the trajectories of the first and second electron beams to be controlled independently. The first control loop iteratively attempts to reduce the first quantity. In particular, the first control loop attempts to move the first electron beam such that its transverse position is closer to that of the second electron beam. The second control loop iteratively attempts to move the second electron beam towards a desired transverse position.

Rather than using the absolute transverse positions of the two different electron beams, the electron beam transport system 40 and method uses the first quantity (which is indicative of a difference in the transverse position of the two different electron beams) and the second quantity (which is indicative of an average transverse position of the two different electron beams). Since the absolute transverse positions of the two different electron beams are not used as control parameters input into the control loops, advantageously, the electron beam transport system 40 and method can be applied in arrangements wherein the positions of the first and the second electron beams cannot be temporally resolved.

The electron beam transport system 40 and method are particularly suitable for controlling the position of two different electron beams within an energy recovering linear accelerator (ERL).

In some embodiments, the above-described first and second control loops operate at different frequencies. It will be appreciated that, in this context, the frequency of a control loop (i.e. the first control loop or the second control loop) is inversely proportional to the time delay between successive iterations of the control loop. This may alternatively be referred to as an update rate or, for an analogue controller 48, bandwidth. For example, the first control loop may operate as a relatively fast control loop and the second control loop may operate as a relatively slow control loop. This may ensure that the two control loops are stable. It may be desirable for the first and second control loops to operate at two different frequencies wherein a ratio of the two different frequencies is not an integer. This may promote better stability of the two control loops.

Although embodiments of particle accelerators according to the present invention have been described as forming part of a free electron laser, it will be appreciated that these particle accelerators may have any other alternative use. For example, the particle accelerators may be for use in the study of fundamental processes or the generation of synchrotron radiation through mechanisms other than the free electron laser interaction.

Whilst embodiments of a radiation source SO have been described and depicted as comprising a free electron laser FEL, it should be appreciated that a radiation source may comprise any number of free electron lasers FEL. For example, a radiation source may comprise more than one free electron laser FEL. For example, two free electron lasers may be arranged to provide EUV radiation to a plurality of lithographic apparatus. This is to allow for some redundancy. This may allow one free electron laser to be used when the other free electron laser is being repaired or undergoing maintenance.

Lithographic system LS may comprise any number of lithographic apparatus. The number of lithographic apparatus which form a lithographic system LS may, for example, depend on the amount of radiation which is output from a radiation source SO and on the amount of radiation which is lost in a beam delivery system BDS. The number of lithographic apparatus which form a lithographic system LS may additionally or alternatively depend on the layout of a lithographic system LS and/or the layout of a plurality of lithographic systems LS.

Embodiments of a lithographic system LS may also include one or more mask inspection apparatus MIA and/or one or more Aerial Inspection Measurement Systems (AIMS). In some embodiments, the lithographic system LS may comprise a plurality of mask inspection apparatuses to allow for some redundancy. This may allow one mask inspection apparatus to be used when another mask inspection apparatus is being repaired or undergoing maintenance. Thus, one mask inspection apparatus is always available for use. A mask inspection apparatus may use a lower power radiation beam than a lithographic apparatus. Further, it will be appreciated that radiation generated using a free electron laser FEL of the type described herein may be used for applications other than lithography or lithography related applications.

The term "relativistic electrons" should be interpreted to mean electrons which have relativistic energies. An electron may be considered to have a relativistic energy when its kinetic energy is comparable to or greater than its rest mass energy (511 keV in natural units). In practice a particle accelerator which forms part of a free electron laser may accelerate electrons to energies which are much greater than its rest mass energy. For example a particle accelerator may accelerate electrons to energies of >10 MeV, >100 MeV, >1 GeV or more.

Embodiments of the invention have been described in the context of a free electron laser FEL which outputs an EUV radiation beam. However a free electron laser FEL may be configured to output radiation having any wavelength. Some embodiments of the invention may therefore comprise a free electron which outputs a radiation beam which is not an EUV radiation beam.

The term "EUV radiation" may be considered to encompass electromagnetic radiation having a wavelength within the range of 4-20 nm, for example within the range of 13-14 nm. EUV radiation may have a wavelength of less than 10 nm, for example within the range of 4-10 nm such as 6.7 nm or 6.8 nm.

The lithographic apparatuses $LA_1$ to $LA_n$ may be used in the manufacture of ICs. Alternatively, the lithographic apparatuses $LA_1$ to $LA_n$ described herein may have other applications. Possible other applications include the manufacture of integrated optical systems, guidance and detection patterns for magnetic domain memories, flat-panel displays, liquid-crystal displays (LCDs), thin-film magnetic heads, etc.

Different embodiments may be combined with each other. Features of embodiments may be combined with features of other embodiments.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A method for controlling the position of two different electron beams, the two electron beams following different trajectories which share a common main path, the method comprising, for at least one control direction:
   determining a first quantity, the first quantity being indicative of a difference in a transverse position of the two different electron beams in the control direction at a measurement point along the common main path;
   determining a second quantity, the second quantity being indicative of an average transverse position of the two different electron beams in the control direction at the measurement point;
   applying a perturbation to a transverse position of a first one of the electron beams at a first actuation point disposed outside of the common main path;
   implementing a first control loop comprising repeating the following steps one or more times:
      (a) determining the first quantity;
      (b) applying a subsequent perturbation to the transverse position of the first electron beam in the control direction at the first actuation point, wherein if the first quantity has increased the subsequent perturbation is in an opposite direction to the previous perturbation applied to the transverse position of the first electron beam and if the first quantity has decreased the subsequent perturbation is in the same direction as the previous perturbation applied to the to the transverse position of the first electron beam; and
      implementing a second control loop comprising repeating the following steps one or more times:
      (a) determining the second quantity;
      (b) applying a perturbation to the transverse position of the second electron beam in the control direction at a second actuation point disposed outside of the common main path, wherein the perturbation applied to the transverse position of the second electron beam is such that the average transverse position of the two different electron beams moves towards a desired transverse position of the two different electron beams.

2. The method of claim 1, wherein the steps of determining at least one of the first quantity and second quantity comprises monitoring the output of a beam position monitor disposed at the measurement point.

3. The method of claim 2, wherein the first quantity is determined from a frequency component of a signal from the beam position monitor that corresponds to the repetition frequency of each of the two electron beams.

4. The method of claim 2, wherein the second quantity is determined from a frequency component of a signal from the beam position monitor that corresponds to the total repetition frequency of electron beams through the common main path.

5. The method of claim 1, wherein the first and second control loops operate at different frequencies.

6. The method of claim 1, wherein the method is applied for two linearly independent control directions.

7. An electron beam transport system for controlling the position of two different electron beams, the electron beam transport system comprising:
   a main electron beam transport module defining a main path, the main electron beam transport module comprising a beam monitoring device disposed at a measurement position along the main path;
   a first input electron beam transport module defining a first input path, the first input electron beam transport module being arranged to deliver a first electron beam to the main electron beam transport module, the first input electron beam transport module comprising a first actuator for applying a perturbation to a transverse position of the first electron beam at a first actuation point disposed along the first input path;
   a second input electron beam transport module defining a second input path, the second input electron beam transport module being arranged to deliver a second electron beam to the main electron beam transport module, the second input electron beam transport module comprising a second actuator for applying a perturbation to a transverse position of the second electron beam at a second actuation point disposed along the second input path; and
   a controller operable to receive a signal from the beam monitoring device and to send control signals to the first actuator and the second actuator;
   wherein the electron beam transport system is operable to determine a first quantity and a second quantity for at least one control direction, the first quantity being indicative of a difference in a transverse position of the first and second electron beams in the control direction at the measurement point and the second quantity being indicative of an average transverse position of the first and second electron beams in the control direction at the measurement point; and
   wherein the controller is further operable to control the trajectories of the first and second electron beams in the control direction independently by implementing a first control loop that iteratively attempts to reduce the first quantity by using the first actuator to perturb a trajectory of the first electron beam, and a second control loop that iteratively perturbs a trajectory of the second electron beam using the second actuator such that the average transverse position of the two different electron beams moves towards a desired transverse position in the control direction.

8. The electron beam transport system of claim 7, wherein the main electron beam transport module comprises a linear accelerator.

9. The electron beam transport system of claim 7, wherein the electron beam transport system is operable to determine the first quantity from a frequency component of a signal from the beam position monitor that corresponds to the repetition frequency of each of the first and second electron beams.

10. The electron beam transport system of claim 7, wherein the electron beam transport system is operable to determine the second quantity from a frequency component of a signal from the beam position monitor that corresponds to the total repetition frequency of electron beams through the common main path.

11. The electron beam transport system of claim 7, wherein the controller is arranged to operate the first and second control loops at different frequencies.

12. The electron beam transport system of claim 7, wherein the electron beam transport system is operable to determine a first quantity and a second quantity for two linearly independent control directions and wherein the controller is operable to control the trajectories of the first and second electron beams in the two linearly independent control directions independently by implementing the first control loop and the second control loop.

13. A particle accelerator comprising the electron beam transport system of claim 7.

14. A free electron laser comprising:
an injector operable to produce a bunched electron beam comprising a plurality of electron bunches;
the particle accelerator of claim 13, arranged to receive the bunched electron beam from the injector and accelerate it to a higher energy; and
an undulator arranged to receive the bunched electron beam from the particle accelerator, the undulator comprising a periodic magnet structure, which is operable to produce a periodic magnetic field and is arranged so as to guide the bunched electron beam along an oscillating path about a central axis.

15. A lithographic system comprising:
the free electron laser of claim 14, which is operable to produce a main radiation beam;
at least one lithographic apparatus; and
a beam delivery system arranged to deliver at least a portion of the main radiation beam to the at least one lithographic apparatus.

\* \* \* \* \*